US006574783B1

(12) United States Patent
Zhuang et al.

(10) Patent No.: US 6,574,783 B1
(45) Date of Patent: Jun. 3, 2003

(54) IC CHIP PLANNING METHOD BASED ON DYNAMIC PARALLEL GENETIC ALGORITHM AND SPECKLE MODEL

(75) Inventors: Wen Jun Zhuang, Singapore (SG); Han Yang Foo, Singapore (SG)

(73) Assignee: Institute of High Performance Computing (SG)

( * ) Notice: Subject to any disclaimer, the term of this patent is extended or adjusted under 35 U.S.C. 154(b) by 0 days.

(21) Appl. No.: 09/526,769

(22) Filed: Mar. 16, 2000

(30) Foreign Application Priority Data

Jun. 23, 1999 (SG) ............................................. 9903108

(51) Int. Cl.[7] ............................................. G06F 17/50
(52) U.S. Cl. .................. 716/8; 716/9; 716/10; 716/1
(58) Field of Search ................... 716/8–14, 1

(56) References Cited

U.S. PATENT DOCUMENTS 5,815,403 A * 9/1998 Jones et al. ................. 364/489
5,875,117 A * 2/1999 Jones et al. ................. 364/491
6,155,725 A * 12/2000 Scepanovic et al. ........... 716/1

* cited by examiner

*Primary Examiner*—Vuthe Siek
(74) *Attorney, Agent, or Firm*—Renner, Otto, Boisselle & Sklar

(57) ABSTRACT

A chip planning method, tool and system for generating a population of gene strings representing floor plans for an integrated circuit, executing crossover on the strings to generate crossover child strings, executing mutation on the strings to generate mutated child strings, applying peristalsis operators to the strings to generate peristalsis child strings, and evaluating the child strings for inclusion in the population. The operators are peristalsis operators based on a speckle model. Dynamic control of migration rates and ranking is also executed, together with controlled race migration and immigration. Dynamic ratio control and optimisation of interconnecting area and pin assignment are also executed.

51 Claims, 20 Drawing Sheets

The Crossover(1)

1 4 5 6 * + + 8 7 * 3 2 * + *  Parent 1

Offspring 1 4 5 6 * * * 8 7 + 3 2 * + +

2 6 8 * * 7 * 5 + 4 * 1 3 + +  Parent 1

The Crossover(2)

1 4 5 6 * + + 8 7 * 3 2 * + *  Parent 1

Offspring 2 6 8 7 * + + 5 4 * 1 3 * + *

2 6 8 * * 7 * 5 + 4 * 1 3 + +  Parent 1

The Crossover(3)

1 4 5 6 * + + 8 7 * 3 2 * + *  Parent 1

Offspring 6 5 4 1 * + + 8 7 * 3 2 * + *

2 6 8 * * 7 * 5 + 4 * 1 3 + +  Parent 1

The Crossover(4)

1 4 5 6 * + + 8 7 * 3 2 * + *  Parent 1

Offspring 8 7 * 3 2 * + 6 + 5 * 4 1 + +

2 6 8 * * 7 * 5 + 4 * 1 3 + +  Parent 1

FIG. 3

PI: Population Inheritance

IC CHIP PLANNING METHOD BASED ON DYNAMIC PARALLEL GENETIC ALGORITHM AND SPECKLE MODEL

The present invention relates to a chip planning method, and a chip planning tool and system.

One of the aspects of integrated circuit design is the determination of a floor plan for the circuit on a semiconductor chip. Once the functional blocks of the circuit and their interrelationship has been determined, an optimum floor plan needs to be determined and the objective is to find a solution that arranges and interconnects the blocks on a chip so as to satisfy a number of competing criteria. The criteria includes minimising layout area, routing congestion, path delay, and a target aspect ratio for the chip.

The difficulties associated with finding a satisfactory floor plan solution become more acute as the transistor count on a circuit increases, such as for a deep sub-micron or very deep sub-micron (DSM/VDSM) chip where the circuit may include over 10 million transistors and have an operating frequency exceeding 500 MHz. The transistors all need to be interconnected whilst meeting strict operation and performance criteria. Issues such as power dissipation, thermal distribution, electromagnetic compatibility (EMC), electromagnetic interference (EMI), signal integrity, clock skew/slow and metal electro-migration risk need to be catered for. The floor plan accordingly needs to be optimised with these criteria in mind to produce a successful DSM/VDSM design. Electronic design automation (EDA) tools are used by most chip designers, such as Intel and Lucent Technologies, to assist in producing a chip plan solution and reduce development cost.

Given the various competing criteria involved in producing a satisfactory chip plan, chip planning can be viewed as a multidimensional optimisation problem. The complexity of the problem is simplified by applying a block structure representation and hierarchical design methodology to the problem. The problem can be specified by:

1) A set of blocks, each of which has $k \geq 1$ alternative implementations. Each implementation is rectangular and either fixed or flexible. For a fixed block, the dimensions and exact pin locations are known. For a flexible or float block, the area is given but the aspect ratio and exact pin locations are unknown.
2) A specification of all nets and a set of paths. The nets are the interconnections of a set of pins of the circuit. Capacitances of sink pins, driver resistances of source pins, internal block delays and capacity and resistance of the interconnects is also specified to calculate path delays.
3) Technology information, such as the number of routing layers available on top of blocks and between blocks, wirepitch for interconnection and input/output pads information etc.

A solution to the problem may then specify the following:
1) A selected implementation for each block.
2) For each selected flexible implementation i, its dimensions $w_i$ and $h_i$ such that $w_i h_i = A_i$ and $I_i \leq h_i/w_i \leq u_i$, where $A_i$ is the given area of implementation i and $I_i$ and $u_i$ are given bounds on the aspect ratio of i, which is assumed to be continuous.
3) An absolute position of each block so that no pair of blocks are closer than a specified minimum distance. For multi-layer designs, it can be assumed that a significant part of the routing is performed on top of the blocks.
4) An orientation and reflection of each block. The term orientation of a block refers to a possible 90° rotation, while reflection refers to the possibility of mirroring the block around a horizontal and/or vertical axis.
5) A pin assignment for each flexible block so that the exact pin locations are fixed.

The complexity of the problem, or the amount of feasible solutions, is of the order:

$$O(k^N * 2^{M-1} * (2M-3)!) \tag{1}$$

where M is the number of blocks, N is the number of flexible blocks ($N \leq M$) and k represents a potential aspect ratio grade for the flexible blocks. Finding an optimal solution for a problem with such a large multidimensional possible solution space has proved extremely difficult, and in particular, it has proved extremely difficult to develop a chip planning method which is computationally efficient for DSM/VDSM chip planning.

One chip planning method for finding and evaluating the possible solutions involves the use of the Genetic Algorithm (GA), such as the method described in H. Esbensen and E. S. Kuh, "Explorer: an interactive floorplanner for design space exploration", Proc. of EuroDAC, 1986, which is herein incorporated by reference. The Genetic Algorithm is an evolutionary process developed by John Holland in 1992 which uses fixed length character strings to represent genetic information defining a set or population of individual solutions that can undergo evolutionary changes to produce optimal solutions. The algorithm begins by initially operating on a random population of possible solutions which are represented by respective gene strings. Each string can be evaluated by a decoder and a "fitness" score or rank assigned to it representing how good a solution it provides to the problem. The strings with the lower scores can then be discarded and the higher scoring strings can be continued by the algorithm. The remaining strings are then used to generate a new set of strings for evaluation. New strings are created by "crossover" which involves exchanging parts of a string between two parent strings of the previous generation. Also new strings are generated by the process of "mutation", which involves making small random adjustments to the strings. After many generations, the population is then dominated by strings which represent the best possible solution to the problem.

The problem with existing genetic algorithm chip planning methods is that they are time consuming and computationally inefficient. They also have a low probability of reaching satisfactory solutions. For example, the work of the University of California, Berkeley, discussed in the article mentioned above adopts a sequential methodology with static optimisation processes and cannot ensure that an optimal solution for a DSM/VDSM chip is obtained.

In accordance with the present invention there is provided a chip planning method, including:
generating a population of gene strings representing floor plans for an integrated circuit;
executing crossover on said strings to generate crossover child strings;
executing mutation on said strings to generate mutated child strings;
applying operators to said strings to generate further child strings; and
evaluating said child strings for inclusion in said population.

Advantageously the further child strings may be generated by peristalsis operators based on a speckle model.

The present invention also provides a chip planning system, including:
- means for generating a population of gene strings representing floor plans for an integrated circuit;
- means for executing crossover on said strings to generate crossover child strings;
- means for executing mutation on said strings to generate mutated child strings;
- means for applying operators to said strings to generate further child strings; and
- means for evaluating said child strings for inclusion in said population.

The present invention also provides a chip planning tool stored on computer readable storage media, including:
- code for generating a population of gene strings representing floor plans for an integrated circuit;
- code for executing crossover on said strings to generate crossover child strings;
- code for executing mutation on said strings to generate mutated child strings;
- code for applying operators to said strings to generate further child strings; and
- code for evaluating said child strings for inclusion in said population.

Advantageously the tool may include code for executing dynamic control, dynamic ranking, block sizing and pin assignment.

A preferred embodiment of the present invention is hereinafter described, by way of example only, with reference to the accompanying drawings, wherein:

FIG. 3 is a diagram of crossover of the method applied to parent strings;

A chip planning method, as described below, has been developed for DSM/VDSM chip planning and is based on a dynamic parallel genetic algorithm (DPGA) that represents an improvement on the genetic algorithm for chip planning. The method is also based on a speckle model, described below, for searching for optimal solutions in a multidimensional space. The model describes the distributive character of the solutions and indicates that any traditional random searching method, such as that of the GA, is inefficient.

Figure 1:
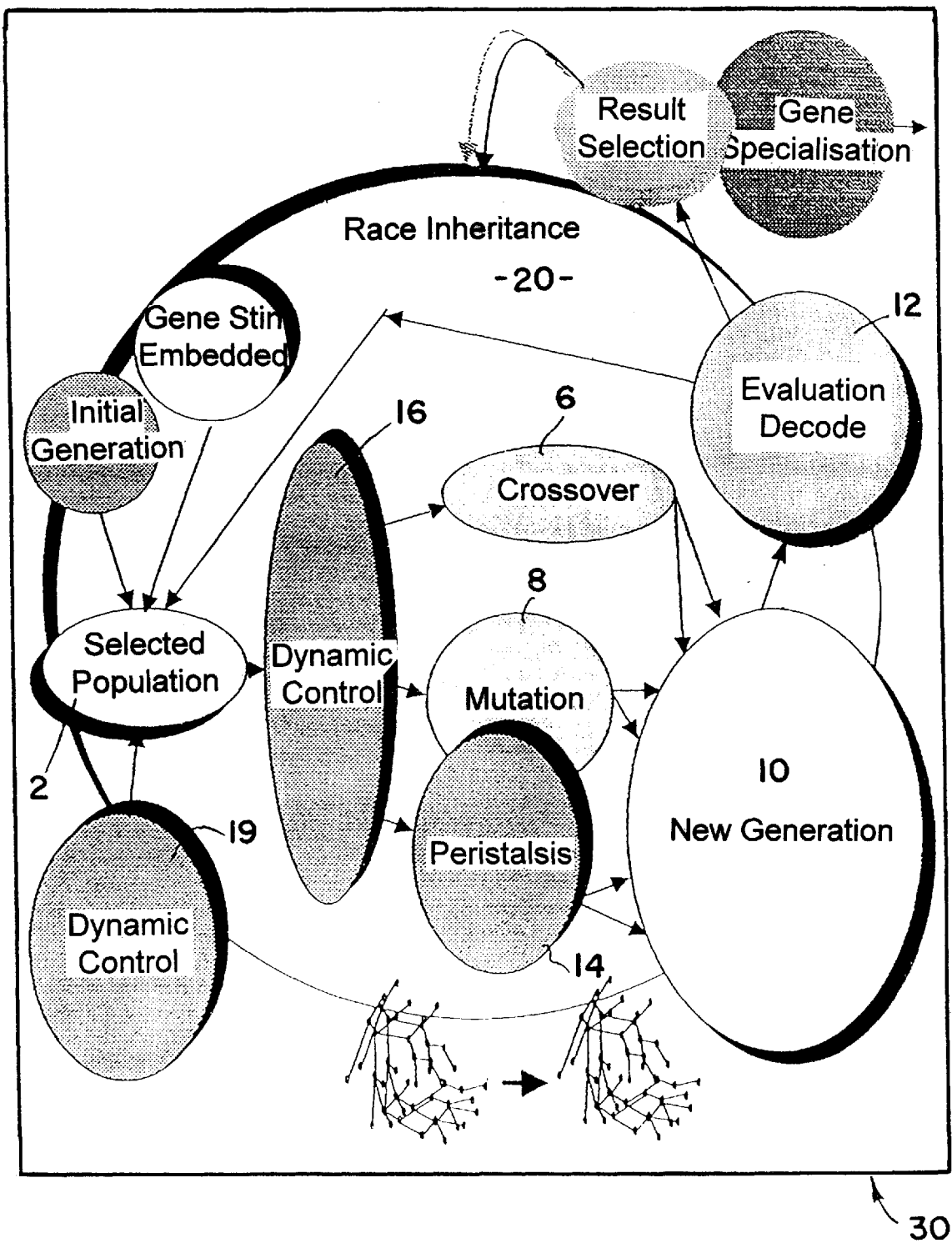
FIG. 1 is a block diagram of a preferred embodiment of a chip planning system for executing a chip planning method.

The chip planning method, as shown in FIG. 1, still involves the basic steps of the GA, such as initial generation 2 of the gene strings that form the initial selected population 4 to be operated on, crossover 6 and mutation 8 to provide a new generation 10 of child strings derived from the first generation 4, and then evaluating or decoding the strings 12 of the new generation to assign fitness or rank values to the new generation 10 when used to form the population 4. These basic steps are well known to those skilled in the art.

In addition, the method applies a set of peristalsis operators 14 to the population 4 to generate additional child strings for the new generation 10. Dynamic control steps 16 are also executed to control the crossover, mutation and peristalsis steps 6, 8 and 14, and dynamic control steps 18 are also additionally executed to further process the population 4, which includes dynamic ranking and dynamic ratio control. The planning method also executes parallel racial inheritance 20 which involves executing a two-dimensional control of the evolution process, instead of just the single vertical migration along races of child strings. Horizontal migration is also executed to provide immigration between different solution races. Two-dimension migration renders the method more efficient and provides a high probability of reaching satisfactory solutions.

A chip planning system 30 for executing the method can be provided by a Sun Microsystems E10K™ workstation 30 running chip planning code stored on the workstation and which executes the chip planning method. The system 30 when executing the code is able to display the solutions of the population 4 for a chip designer during iteration of the method. The designer can then verify or optimise the system design according to the demands of DSM/VDSM technology. The design can be investigated at the physical chip level and adjusted, as required, to meet timing or density requirements for the design to be fabricated.

The objective function to be solved by the method can be represented by $$F(I)_p = \rho_a A(I) + \rho_d D(I) + \rho_c C(I) + \rho_r (R(I) - R_{target}) + \ldots \quad (2)$$

where the objective is to MIN$\{F(I)_\rho\}$ and, where:
- A(I) is chip area corresponding to the individual chip planning result I;
- D(I) is maximal path delay corresponding to the individual chip planning result I;
- C(I) is routing congestion corresponding to the individual chip planning result I;
- R(I) is a chip aspect ratio corresponding to the individual chip planning result I;
- P(J)=$\{J_1, J_2, \ldots, J_g\}$ is the selected solution population 4 with g individual instances; and
- $\rho_a$, $\rho_d$, $\rho_c$, etc. are weights assigned to represent the importance of each term to the function.

A result I+1 may be a better solution which would be accepted as a new member in the solution population if and only if $\exists\ J_k$ and $J_k \in P(J)$, and $F(I+1)_\rho < F(J_k)$ are true. The solution $J_k$ is then replaced by the solution I+1.

The optimal objective function however is somewhat more complex in that what is ultimately required is the following:

$$\text{Optimise:} \begin{cases} \text{MIN } \{A(I)\} \\ \text{MIN } \{D(I)\} \\ \text{MIN } \{C(I)\} \\ \text{MIN } \{|R(I) - R_{target}|\} \end{cases} \quad (3)$$

Optimise:

In this instance I+1 will be accepted as a new member in the selected population 4 if and only if $\exists\ J_k$ and $J_k \in P(J)$, and both [A(I+1)−A(I)$\leq$0 And D(I+1)−D(I)$\leq$0 And C(I+1)−C(I)$\leq$0 And (|R(I+1)−R$_{target}$|−|R(I)−R$_{target}$|)$\leq$0] and [A(I+1)<A(I) Or D(I+1)<D(I) Or C(I+1)<C(I) Or (|R(I+1)−R$_{target}$|<|R(I)−R$_{target}$|)] are true. The solution $J_k$ will then be replaced by solution I+1.

A speckle model for the solutions to the problem represented by equation (4) shows that the chip plan solutions are distributed discretely, non-monotonically and that there are a large number of local optimal solutions within a multi-dimensional solution space. The probability P of finding a better result decreases with the "distance" from a local optimal solution dramatically, such that:

$$P=K*E^m/D^n \quad (4)$$

where E is error and D is the distance from current best result and K, m and n are constants related to the problem size and which are always greater than 1. The probability of finding an optimal solution is represented by the speckle model which represents equation (4) and the fact that the solutions are distributed as described above. The speckle model indicates that traditional random searching for an optimal solution is inefficient, and that the probability of finding a better solution based on the existing solution population 4 is significantly enhanced if the error in the current solutions 4 is small and searching is conducted a small distance from the current best solution. The speckle model provides a basis for defining a new set of peristalsis operators, as described below. The speckle model also provides a basis for executing dynamic control and ranking, as described below.

A chip floor plan having b blocks can be represented by the following five components:

a) A string of b integers specifying the selected implementations of all blocks. The ith integer identifies the implementation selected for the ith block.

b) A string of real values specifying aspect ratios of selected flexible implementations. The ith value specifies the aspect ratio of the ith selected flexible implementation.

c) An inverse Polish expression of length 2b−1 over the characters {0, 1, . . . , b−1, +,*}. The operands 0, 1, . . . , b−1 denote block identities and +,* are operators. The expression uniquely specifies a slicing-tree for the floor plan, as first introduced in D. F. Wong and C. L. Liu, "A new algorithm for floorplan design", Proc. of the 23rd Design Automation Conference, pp. 101–107, 1986, with + and * denoting a horizontal and a vertical slice, respectively.

d) A bit string of length 2*b* representing the reflection of all blocks. The reflection of the ith block is specified by its bits 2*i* and 2*i*+1.

e) A string of integers specifying a critical sink for each net, used when routing the nets. The ith integer identifies the critical sink of the ith net.

Figure 2:
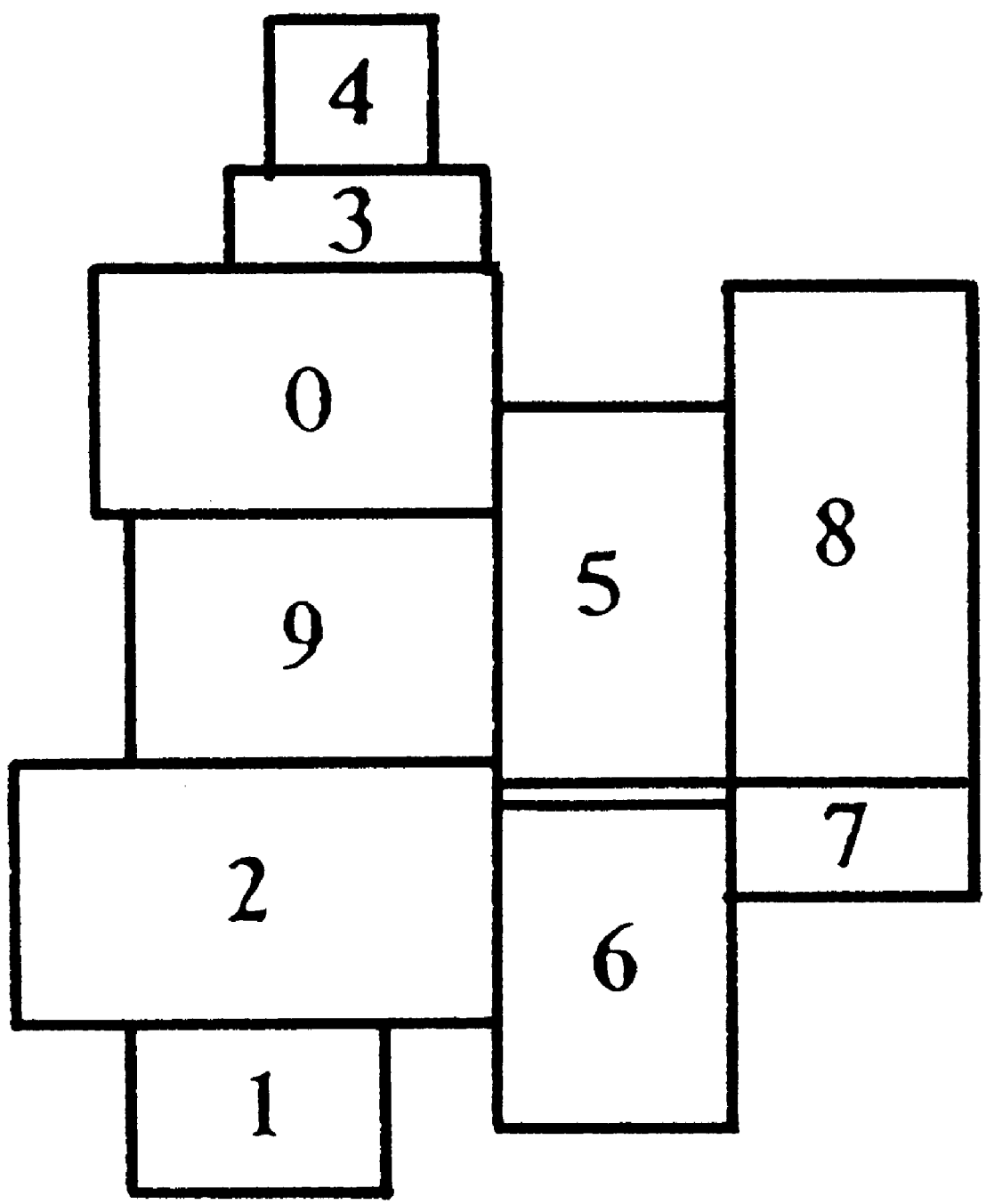
FIG. 2 is a block diagram of a chip floor plan.

The inverse Polish expression can be considered to constitute a gene string representing the floor plan. For example, the Polish expression 12+6*90++34++5*78+*represents the floor plan shown in FIG. 2 which as undergone horizontal compaction.

Given a population 4 of gene strings represented by the inverse Polish expression, crossover 6 can be executed on parent strings which are selected at random with a probability inversely proportional to the strings rank or fitness score, in accordance with the principle of only the strings with the highest fitness scores survive. The chip planning method executes four standard crossover operations, as shown in FIG. 3.

Figure 4:
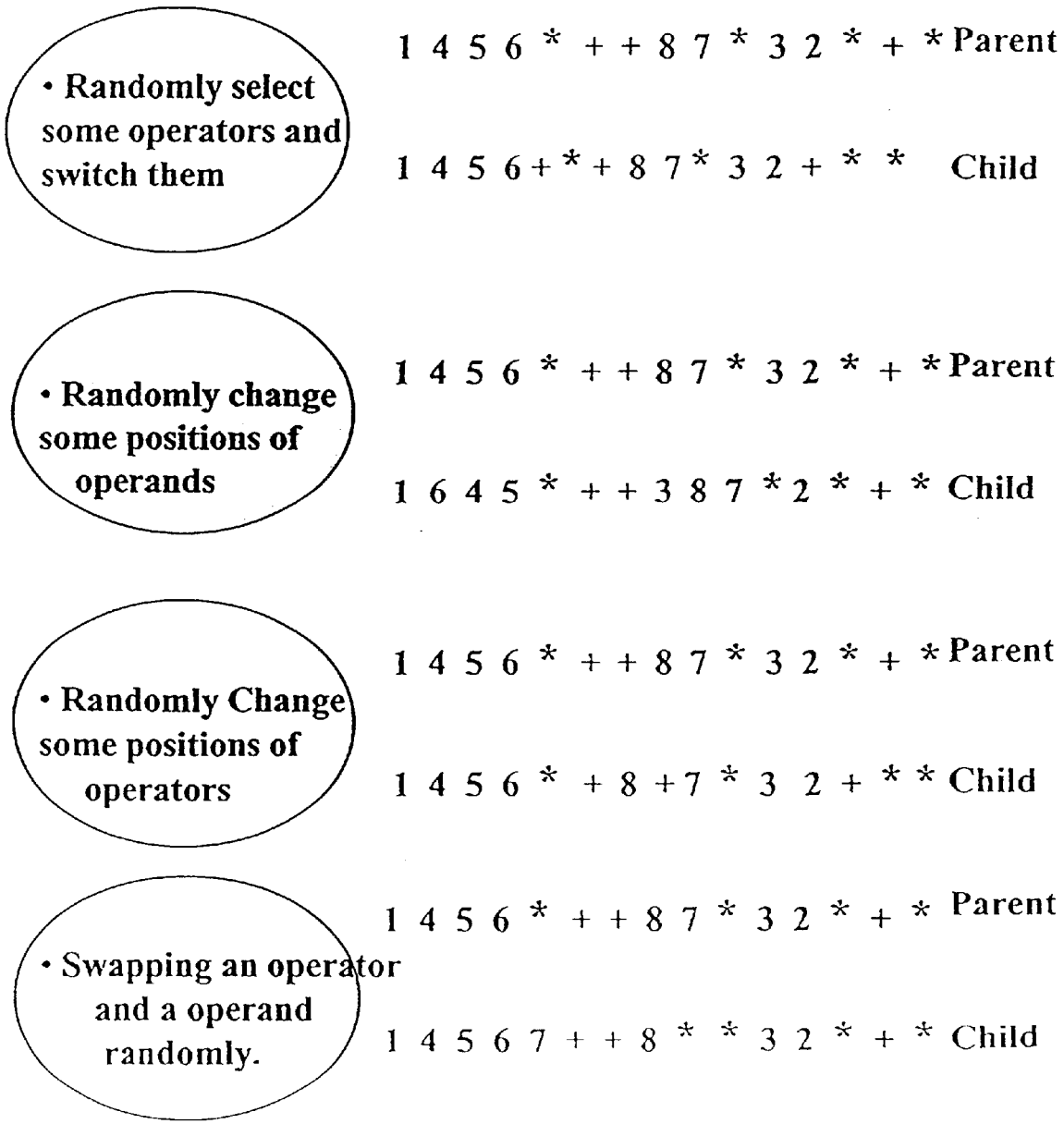
FIG. 4 is a diagram of mutation of the method applied to parent strings.

The strings are then also randomly selected for mutation 8, as shown in FIG. 4, by executing one of the following mutations:

i) Randomly select some of the operators of the string and switch them.

ii) Randomly change some of the positions of the operands of the parent string.

iii) Randomly change some positions of the operators.

iv) Swap an operator and an operand randomly in a parent string.

Figure 5:
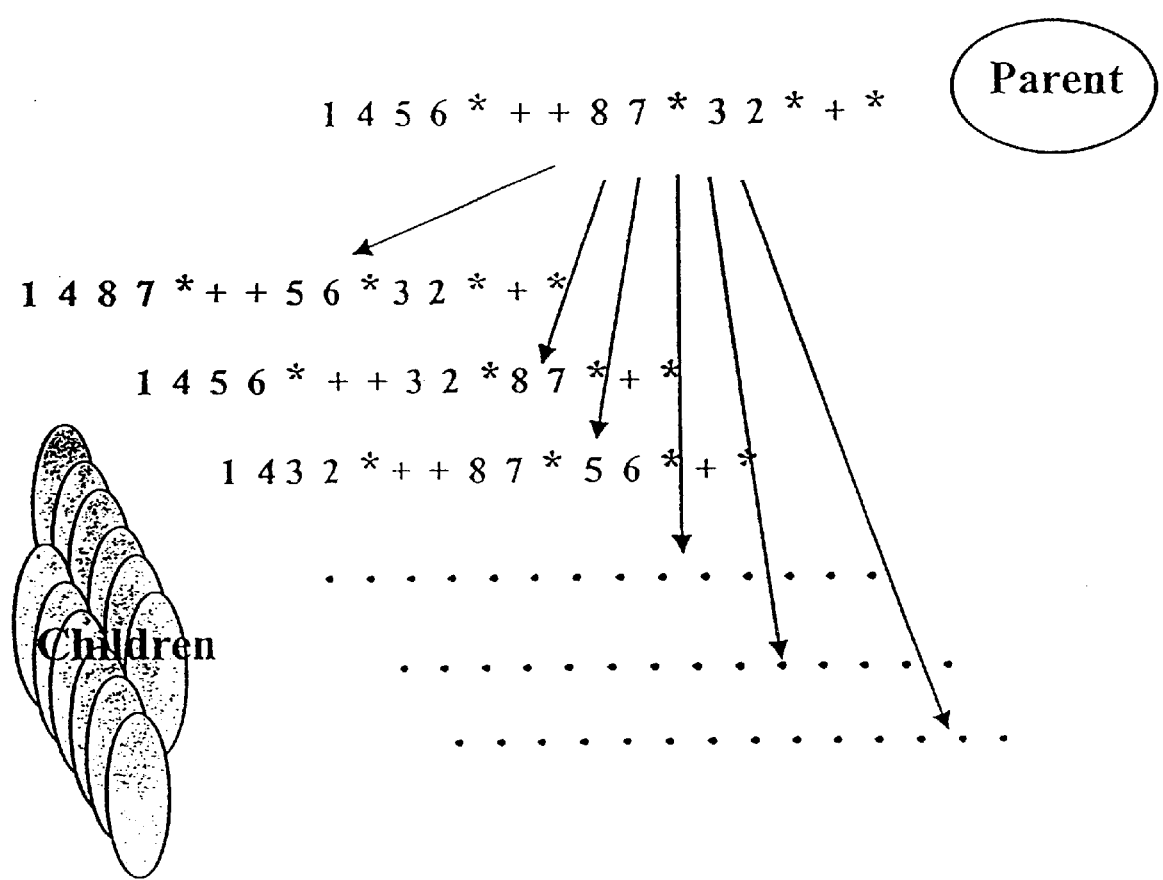
FIGS. 5 to 16 are diagrams of peristalsis operators of the method applied to parent strings.

The chip planning method also executes peristalsis 14 by applying twelve peristalsis operators, which are based on the speckle model for the solution space. As with mutation, the strings produced by the peristalsis operators are only accepted if they constitute a feasible solution than can represent a chip plan. To be feasible that the string must have a length of 2b−1, as explained above, for a number of blocks $n_{block}$ equal to b and have a reasonable number $n_{placing\text{-}operator}$ of placing operators +,*. The condition for a feasible string may be represented by $n_{block} \geq n_{placing\text{-}operator}+1$. The peristalsis operators are as follows:

1. Exchanging "arthrosis". An arthrosis is defined as being a small gene string in the parent which consists of two operands and a subsequent operator. Arthrosis's are exchanged, as shown in FIG. 5.

Figure 6:
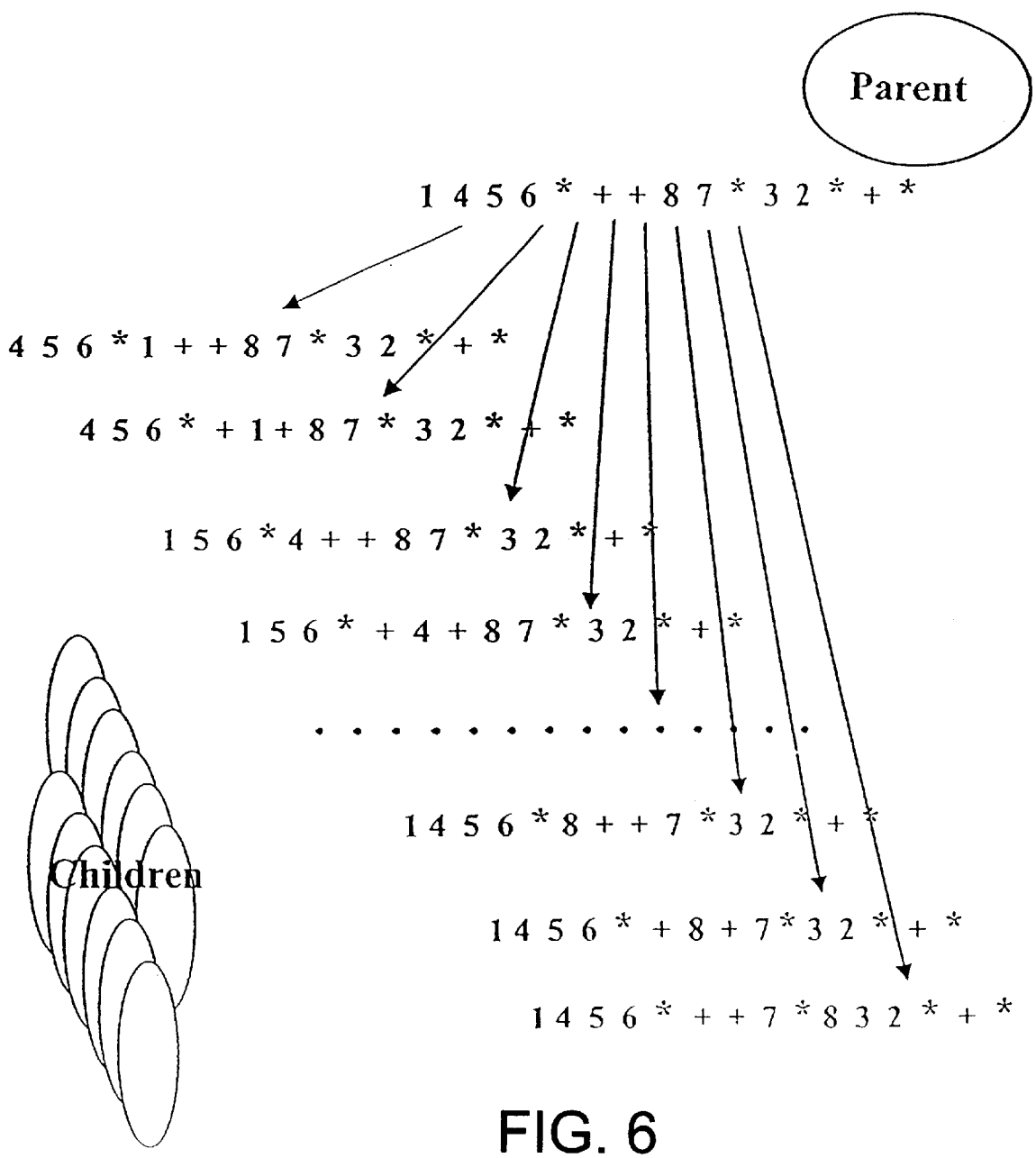

2. Randomly select an operand of the parent and insert it into a different position, provided the new child gene string is feasible, as shown in FIG. 6.

Figure 7:
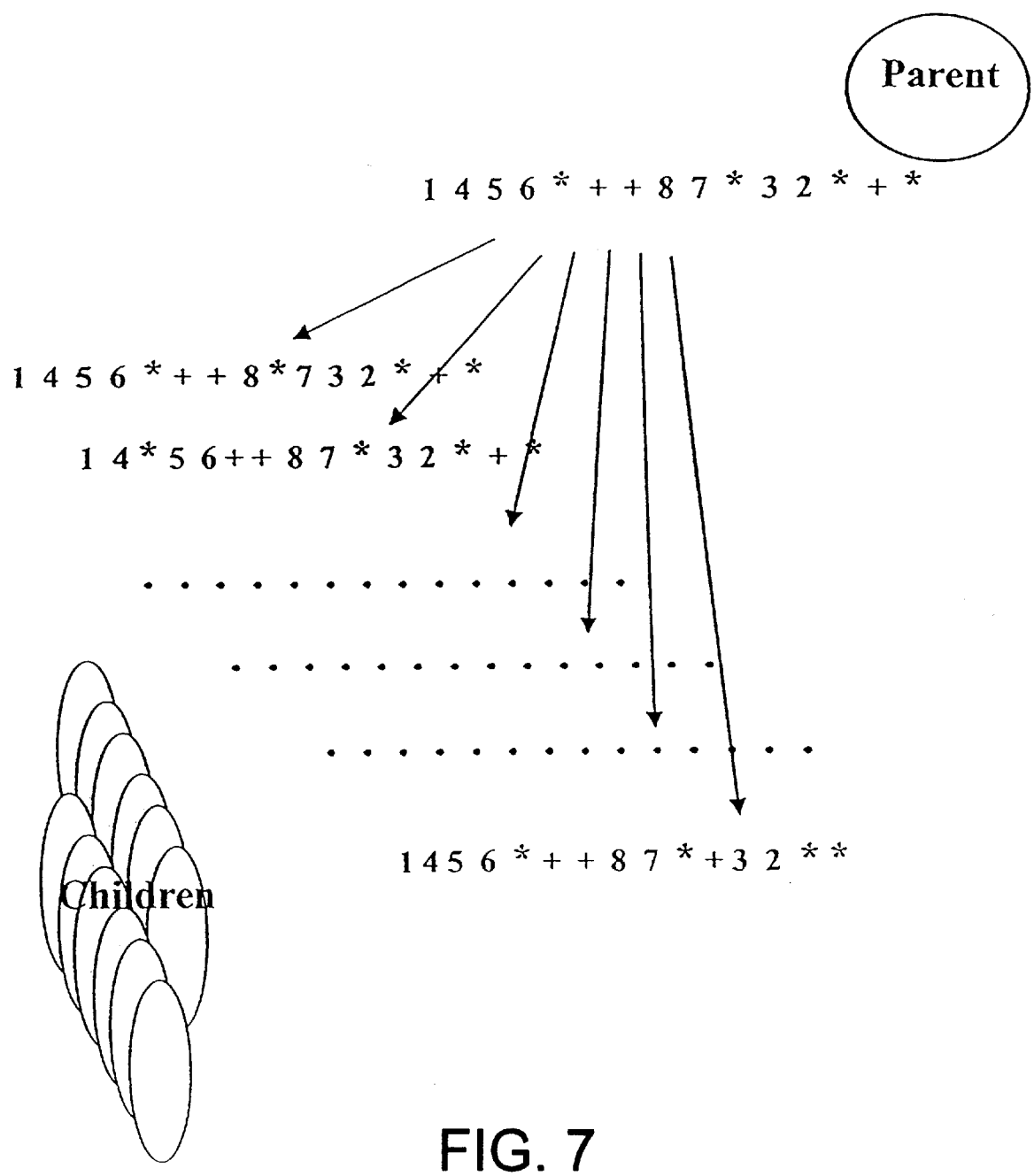

3. Select a random operator in the gene string and insert it in a random but different position, if the new child string is feasible, as shown in FIG. 7.

Figure 8:
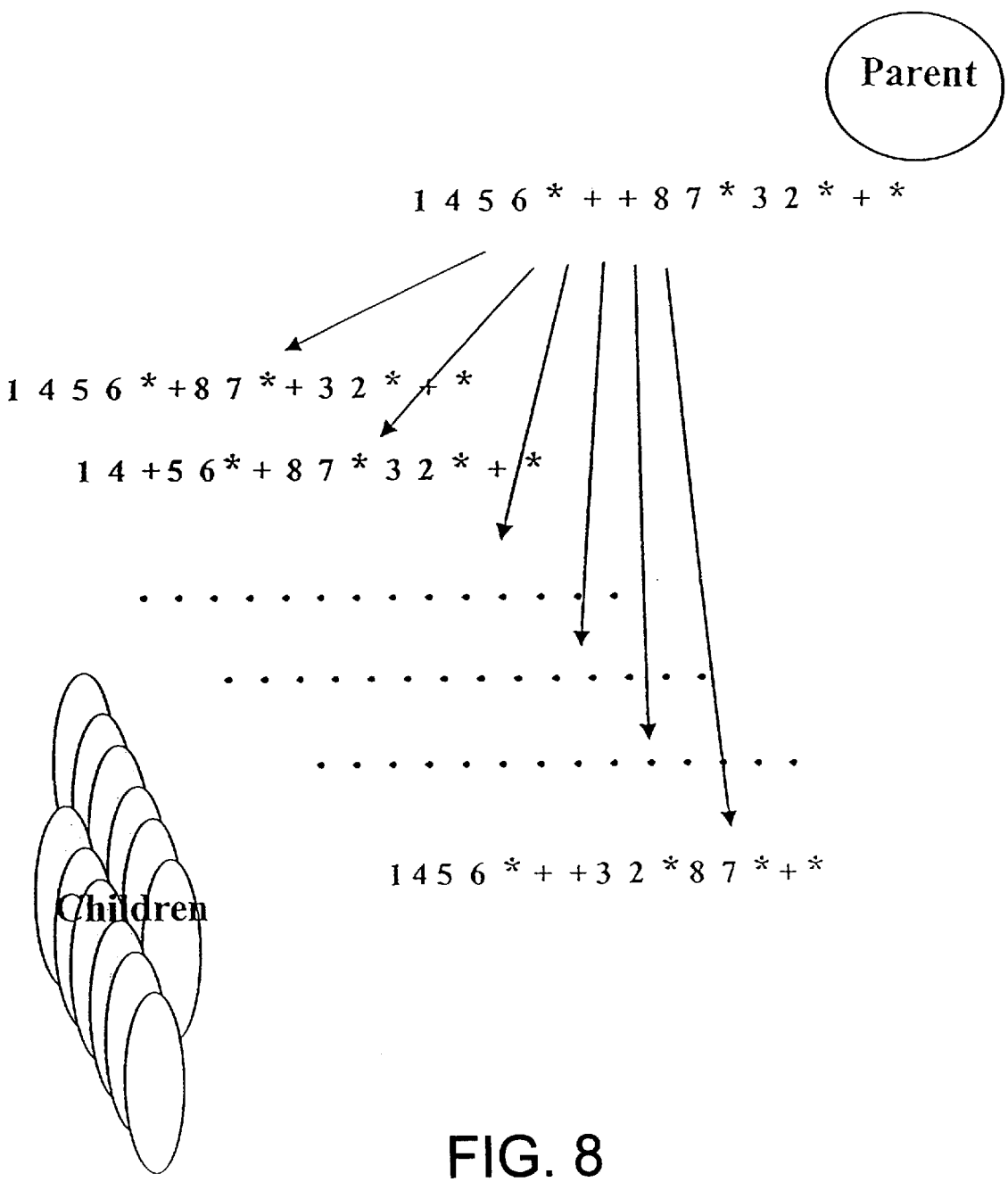

4. Select an arthrosis randomly and insert it in a random but different position, as shown in FIG. 8.

Figure 9:
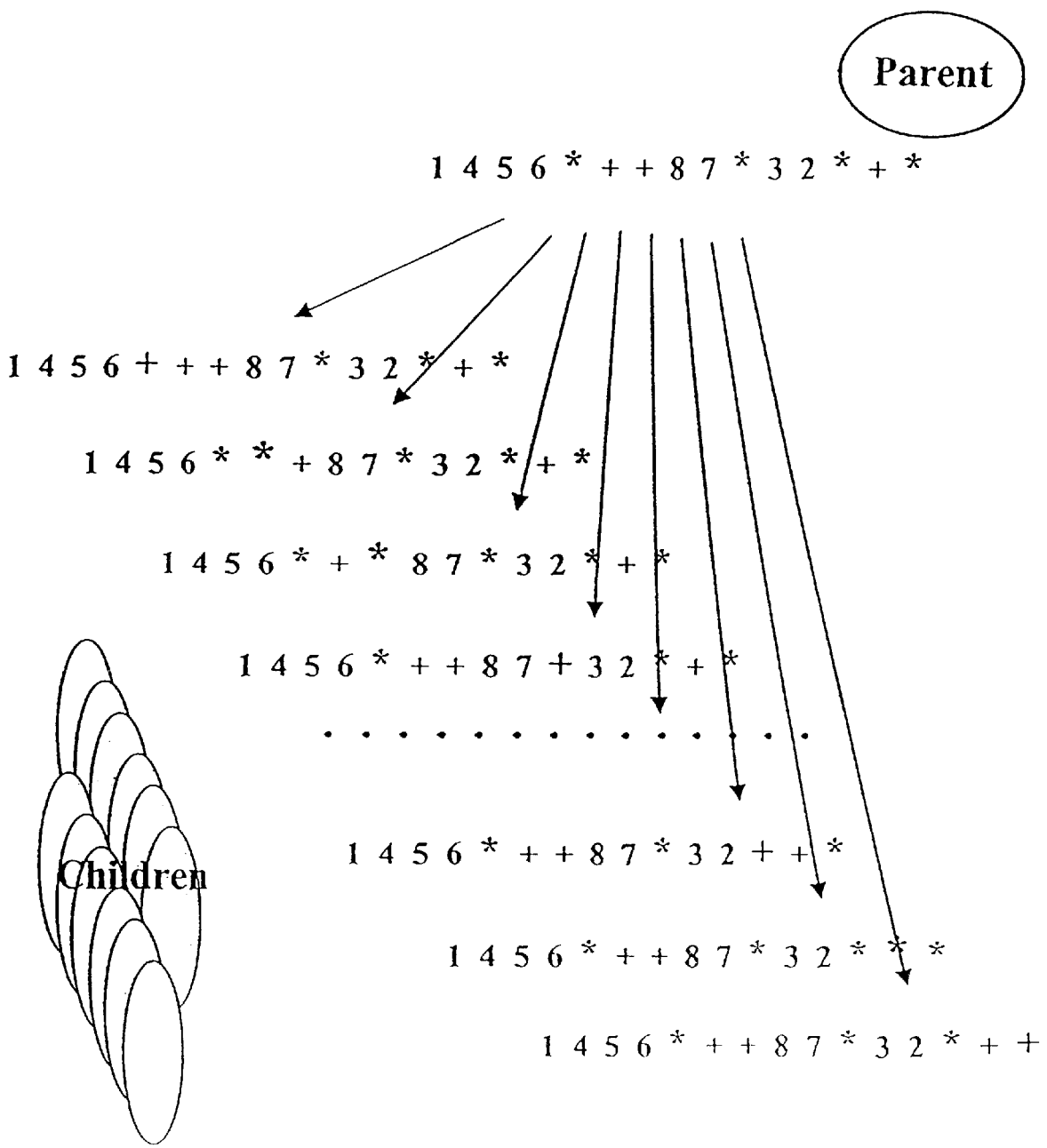

5. Switch an operator randomly, as shown in FIG. 9.

Figure 10:
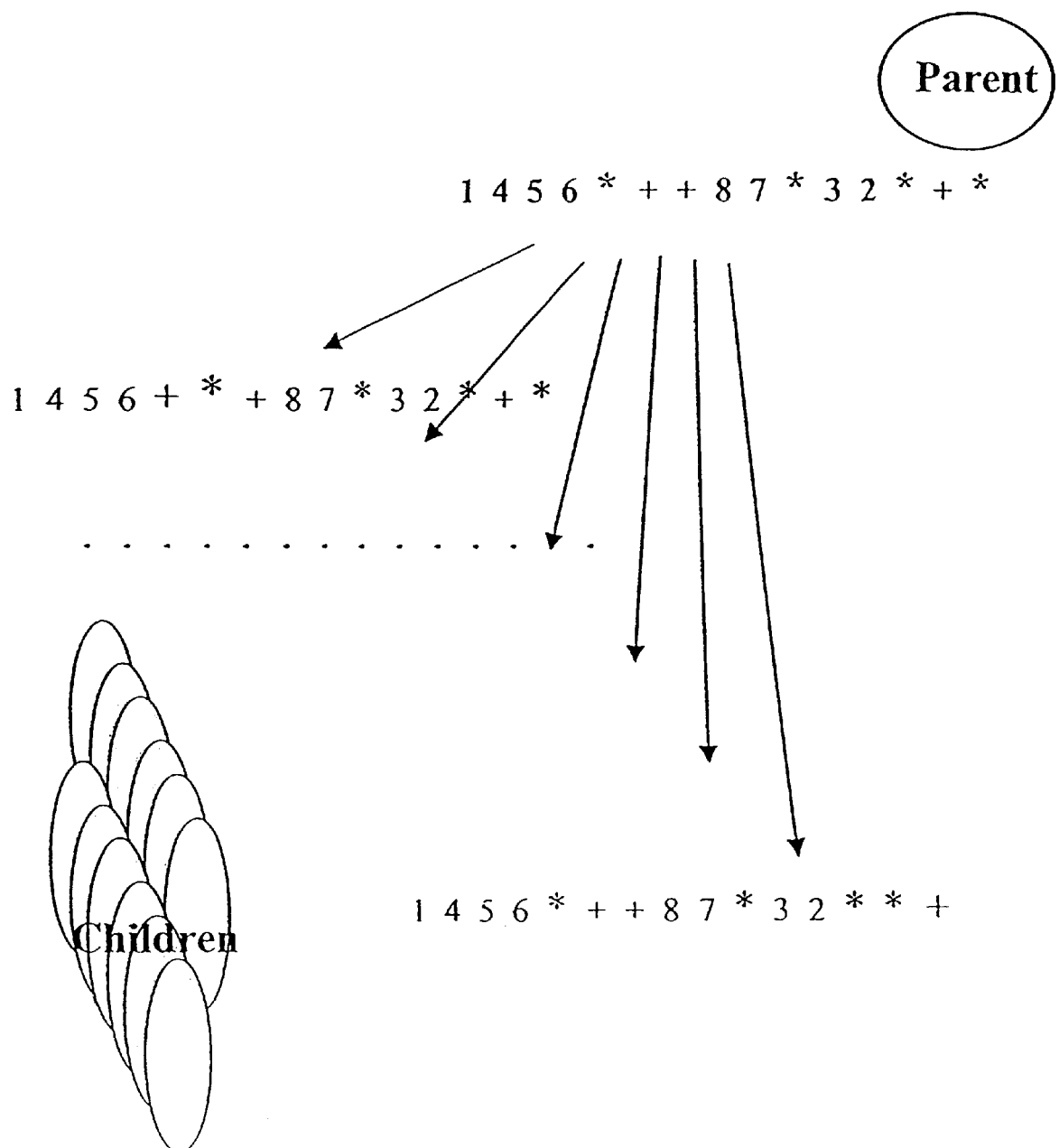

6. Exchange two neighbouring operators randomly, as shown in FIG. 10.

Figure 11:
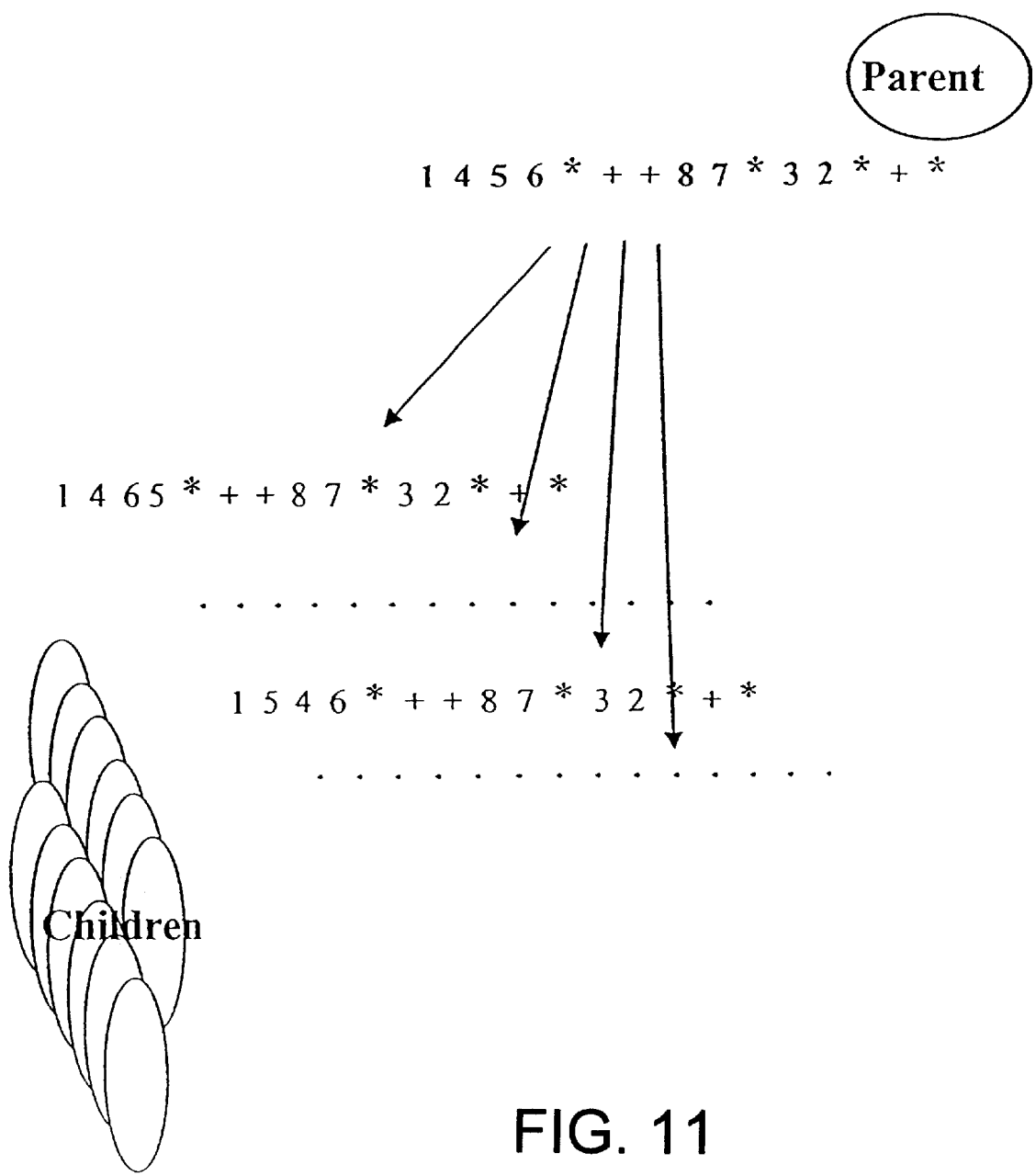

7. Exchange two neighbouring operands, as shown in FIG. 11.

Figure 12:
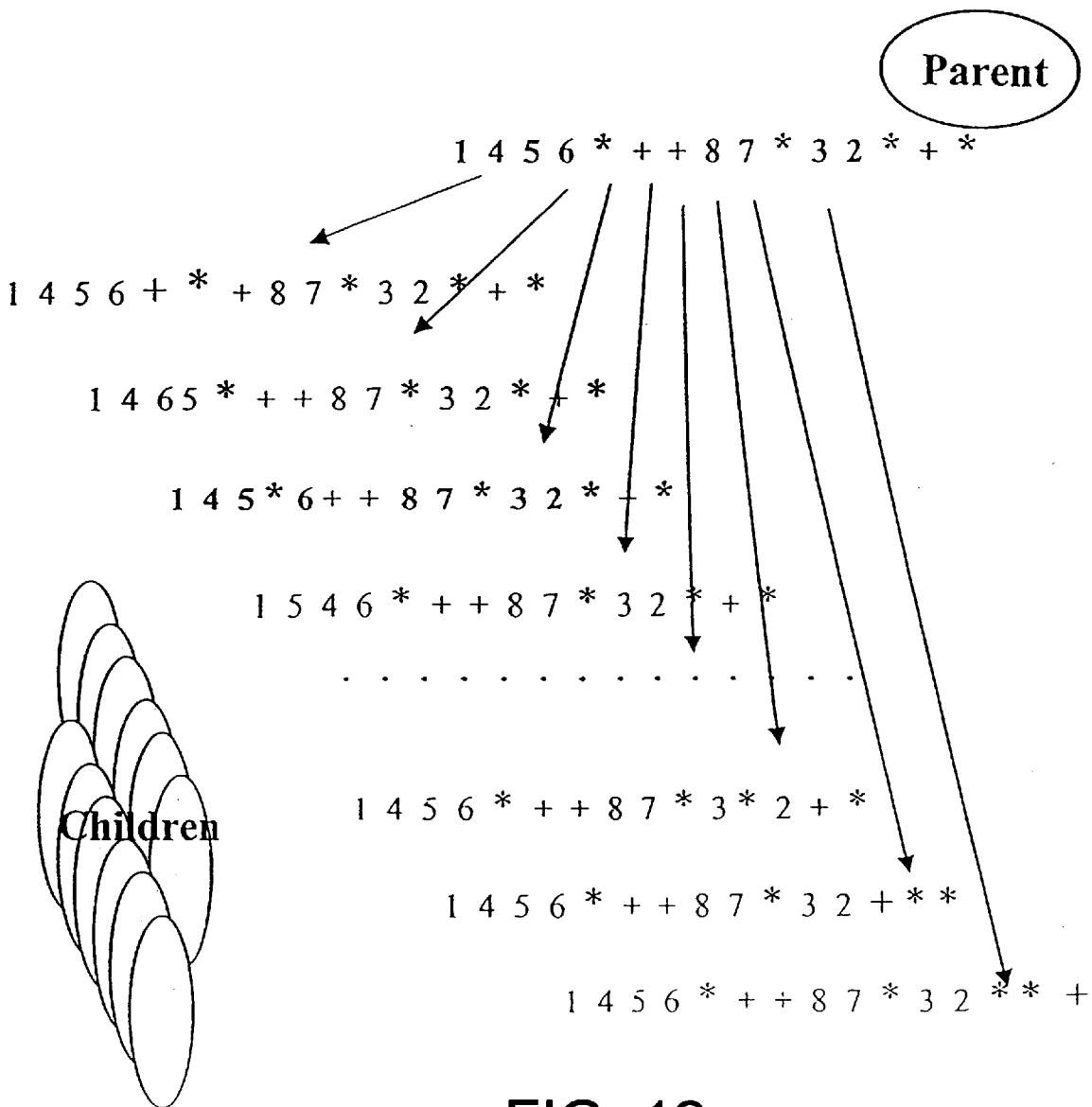

8. Exchange two neighbouring components, i.e. operand or operator, and accept the new string if it is feasible, as shown in FIG. 12.

Figure 13:
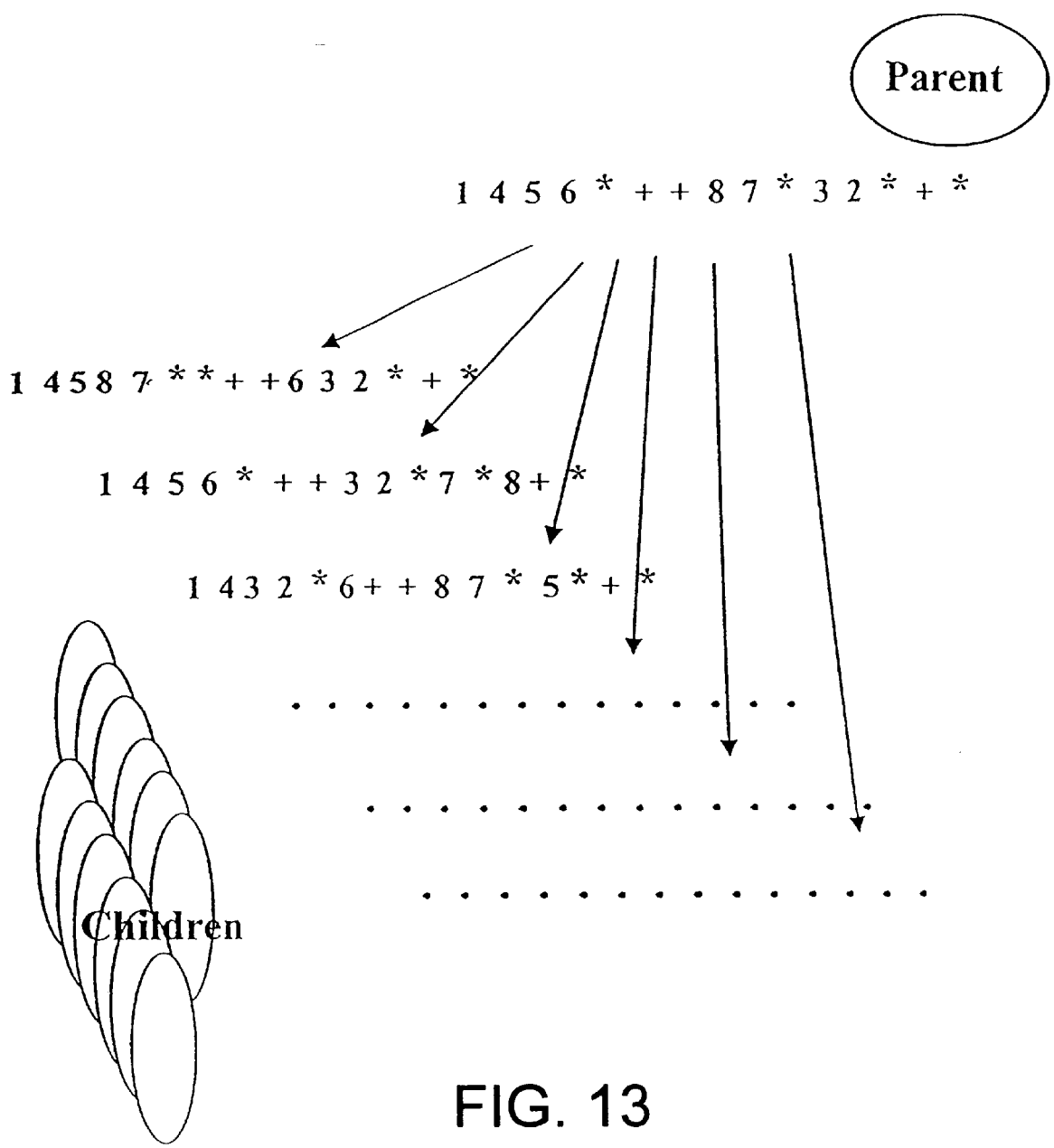

9. Exchange one operand and one arthrosis, as shown in FIG. 13.

Figure 14:
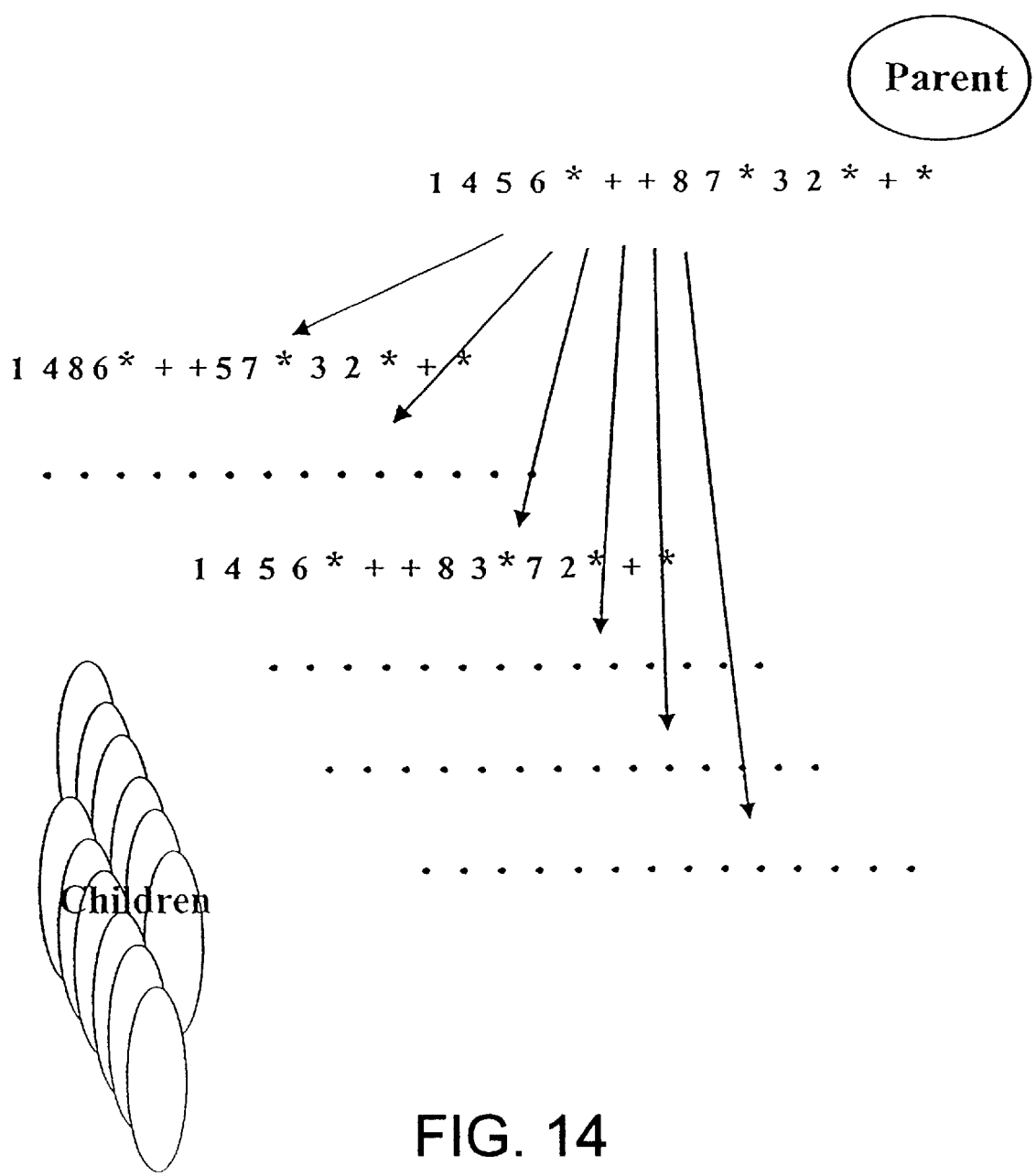

10. Exchange two operands randomly, as shown in FIG. 14.

Figure 15:
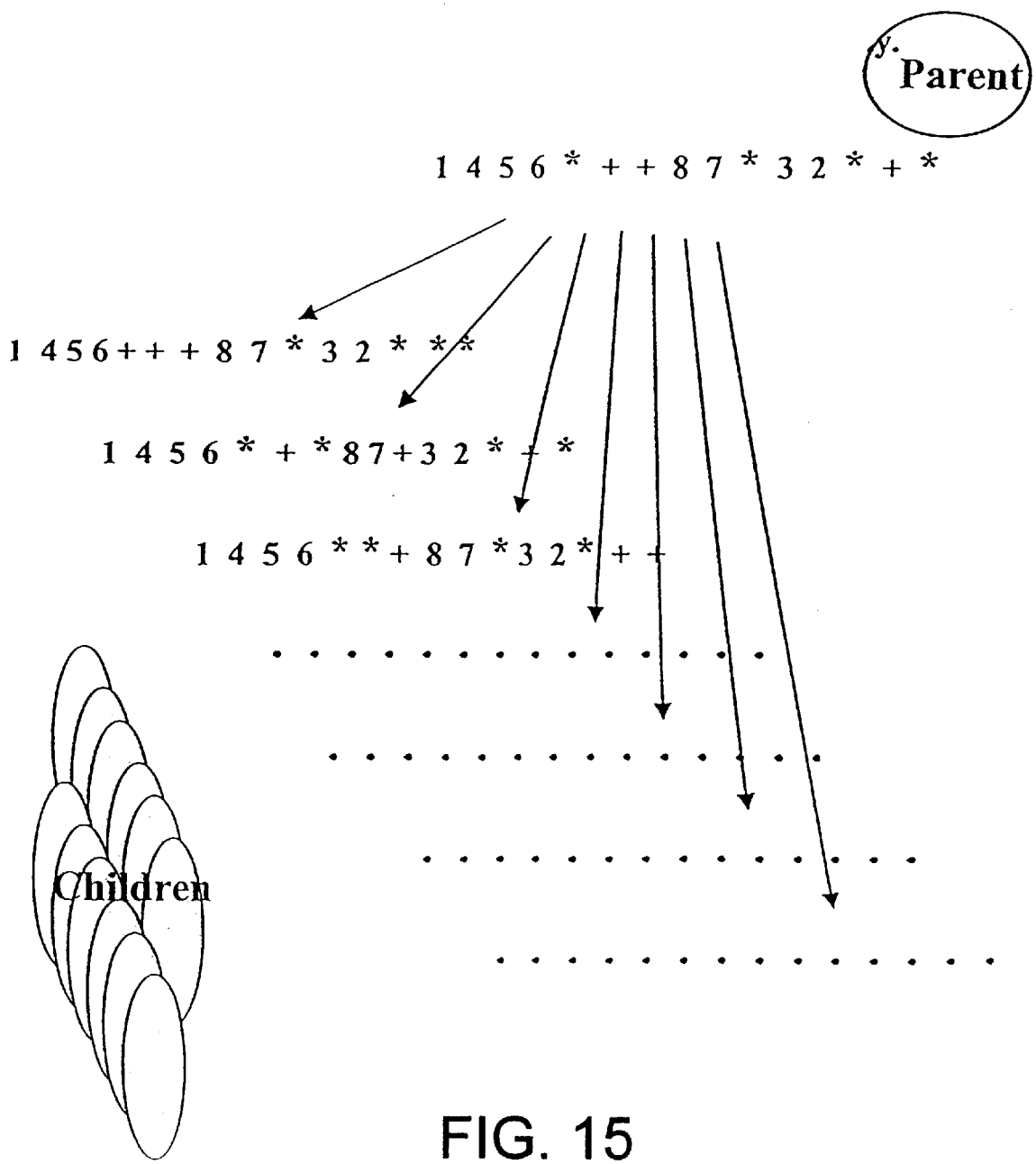

11. Exchange two operators randomly, as shown in FIG. 15.

Figure 16:
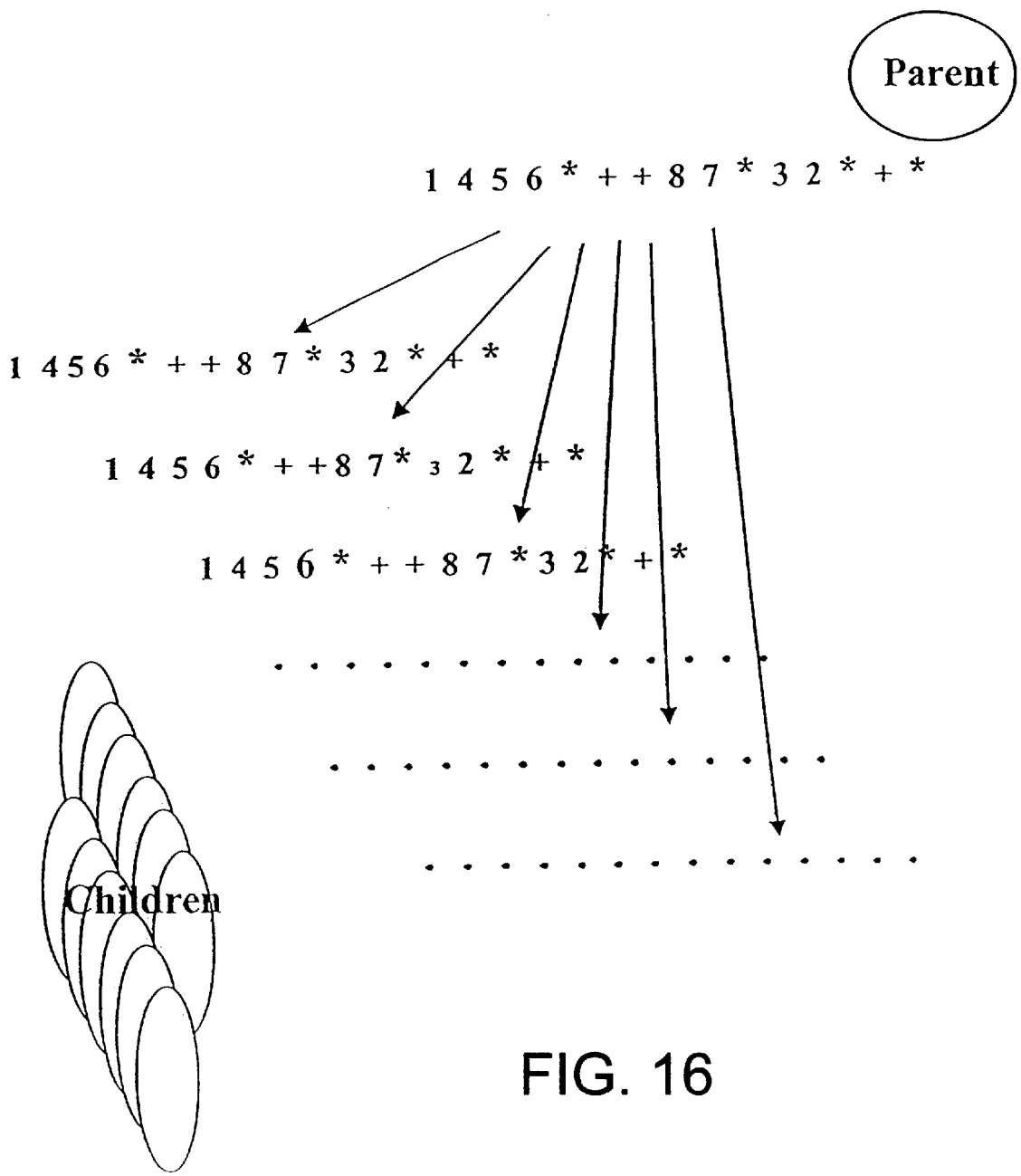

12. Change the ratio for one block as shown in FIG. 16, this can be represented in the gene inverse Polish expression by changing the size of the operand characters.

The dynamic control step 16 is executed to control migration of the population 4 by crossover 6, mutation 8 and peristalsis 14 to the new generation 10. The control is based on the probability of a gene string having children which will migrate to the new generation 10 on executing the crossover 6, mutation 8 or peristalsis 14 steps. By selecting CSrate as the rate of crossover in the migration, MPrate as the rate of mutation and peristalsis in the migration, Mutrate as the rate of mutation in migration, and Perrate as the rate of peristalsis in the migration, the following holds:

Mutrate+Perrate=MPrate; and MPrate+CSrate=1.0

Dynamic control can then be executed by setting the above rates using the following equations:

Mutrate=MPrate*$N_{mutation}$/($N_{mutation}$+$N_{perrate}$)

Perrate=MPrate*$N_{perrate}$/($N_{mutation}$+$N_{perrate}$)

where $N_{mutation}$ and $N_{perrate}$ represent the number of gene strings subject to mutation and peristalsis, respectively. The rates for mutation and peristalsis, and the dependent rate for crossover, are set by determining MPrate as follows. Firstly using the number of strings in the current generation $N_{generation}$ and where ACTgen is an integer representing the current generation number, a level for MPrate can be set using the following:

$$MPrate = \eta_1 * \text{If ACTgen} > \gamma * (N_{generation}^1/M)$$

$$MPrate = \eta_2 * \text{If ACTgen} > \gamma * (N_{generation}^2/M)$$

$$MPrate = \eta_k * \text{If ACTgen} > \gamma * (N_{generation}^k/M)$$

where M is the amount of blocks, $\gamma$ is a constant for control purpose, and $$\eta_1^* < \eta_2^* < \ldots < \eta_k^*.$$

$$N_{generation}^1 < N_{generation}^2 < \ldots < N_{generation}^k$$

such that $\eta_1^*, \eta_2^*, \ldots, \eta_k^*$ represent different rate ranges or control levels. For example, $\eta_1^*$ may be a rate range from 10–20%, whereas $\eta_2^*$ may be a rate range from 20–27%.

Subsequently MPrate can be set based on different error levels $\delta$ using the following equations, where again $\eta_1, \ldots, \eta_k$ represent different control levels or rate ranges:

$$MPrate = \eta_1 \text{ If } MAX\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta_1$$

$$MPrate = \eta_2 \text{ If } MAX\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta_2$$

...

$$MPrate = \eta_k \text{ If } MAX\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta_k$$

and $$\eta_1 < \eta_2 < \ldots < \eta_k$$

$$\delta_1 > \delta_2 > \ldots > \delta_k$$

The dynamic control steps 18 executed on the population 4 involves executing ratio control on the flexible blocks or float blocks of the population.

Assuming the float blocks can be represented by $R\{r_1, r_2, \ldots r_N\}$ where N is the amount of float blocks, $r_j$ is the ratio of block j in current solution, then dynamic float block ratio control can be executed for the new generation $R^*\{r_1^*, r_2^*, \ldots r_N^*\}$. This is done by selecting the new ratios for the float blocks on the basis of the following equation:

$$r_j^* = (\text{Uniform}[U,L]_j + r_j((10.0 - \beta) * MPrate))/(1.0 + ((10.0 + \beta) * MPrate))$$

where U is upper bound of the ratio of float block j and L is low bound of ratio for float block j, Uniform is a random number generator based on a uniform distribution function, MPrate is the mutation and peristalsis rate, such that 1.0 > MPrate > 0.0, and $\beta$ is a constant parameter, such as 5.0.

The dynamic control 18 executed on the population also includes a dynamic ranking strategy for adjusting the ranking or fitness scores of the population. The dynamic ranking strategy is first executed on the basis of the following equations:

$$F(I)_\rho = \rho_a A(I) + \rho_d D(I) + \rho_c C(I) + \rho_r R(I) + \ldots$$

$$\rho_a > \eta_1(\rho_d + \rho_c) \text{ If ACTgen} > \gamma * (N_{generation}^1/M)$$

$$\rho_a > \eta_2(\rho_d + \rho_c) \text{ If ACTgen} > \gamma * (N_{generation}^2/M)$$

...

$$\rho_a > \eta_k(\rho_d + \rho_c) \text{ If ACTgen} > \gamma * (N_{generation}^k/M)$$

where for the different control levels 1, 2, ..., k, $$\eta_1 > \eta_2 > \ldots > \eta_k$$

$$N_{generation}^1 < N_{generation}^2 < \ldots < N_{generation}^k$$

As F(I) is the objective function, a solution with a higher F(I) will be ranked as a higher quality solution. The four weights in the equation for the objective function $\eta_a, \eta_d, \eta_c$ and $\eta_r$ are adjusted to determine the contribution from the various critical parameters to F(I). The constant $\eta$ decreases when the generation number $N_{generation}$ increases. This means that the area item A(I) contributes more in the earlier stages when the generation number $N_{generation}$ is small compared to the other parameters. The weight for the area item $\eta_a$ is adjusted to decrease with the increasing generation number so as to adjust the contribution of A(I) to the objective function F(I). At a control level k, the solution I can be evaluated to determine its rank relative to the population and the local current best result using the following comparisons:

$$\exists J_k \text{ and } J_k \in P(J), \text{ and both}$$

[A(I)−A(k)≤0 And D(I)−D(k)≤0 And C(I)−C(k)≤0 And (|R(I)−Ratio$_{target}$|−|R(k)−Radio$_{target}$|)≤0] and

[A(I)<A(k) Or D(I)<D(k) Or C(I)<C(k) Or (|R(I)−Ratio$_{target}$|<|R(k)−Ratio$_{target}$|)] and

[A(I)−A$_{best}$≤0 And D(I)−D$_{best}$≤0 And C(I)−C$_{best}$≤0 And (|R(I)−Ratio$_{target}$|−|R$_{best}$−Ratio$_{target}$|)≤0] where A$_{best}$, D$_{best}$, C$_{best}$, R$_{best}$ are local (current) best result in area, delay, congestion and ratio. The process can then proceed to the next control level k+1 provided the following is satisfied.

$$\text{If ACTgen} > \gamma * (N_{generation}^{k+1}/M)$$

where $$N_{generation}^k < N_{generation}^{k+1}$$

Figure 17:
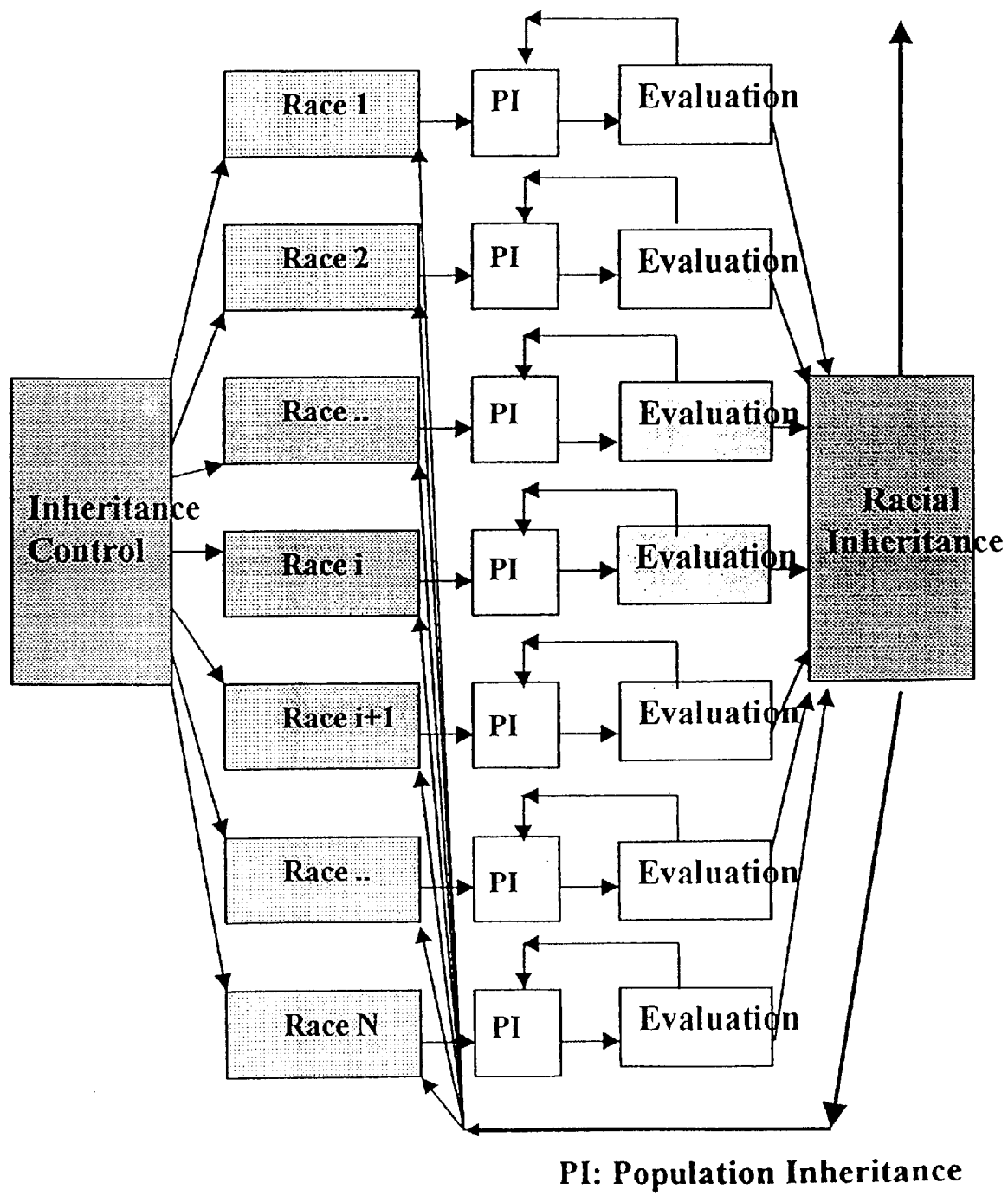
FIG. 17 is a block diagram of parallel racial inheritance of the method.

The chip planning method also executes parallel racial inheritance 20, as shown in FIG. 17. The gene strings in the population 4 and in the new generation 10 can be considered to belong to different individual races, depending on their lineage from given parent string. The races can be assigned different objective functions:

$$F(I)^k \rho = \rho_a^k A(I) + \rho_d^k D(I) + \rho_c^k C(I) + \rho_r^k R(I) + \ldots$$

where k is the number of race, k=1, 2, 3, 4, ..., n, by differentiating the weights $$\rho_a^k, \rho_d^k, \rho_c^k, \text{ and } \rho_r^k \ldots$$

For example the weights could be differentiated by:

$$\rho_a^k \gg \rho_d^k \text{ and } \rho_c^k \ldots \text{ for the k node or race, and } \rho^{k+1}_d \gg \rho^{k+1}_a \text{ and } \rho^{k+1}_c \ldots \text{ for the k+1 node or race}$$

Essentially the above establishes for each individual race a differentiated genesis and weighted objection function so that the migration process for each race constitutes an independent or isolated migration environment. Migration between the races is then strictly controlled so that mixing only occurs when the races are no longer producing independent improved solutions. Race migration is implemented if and only if a race inheritance condition is satisfied using the following condition control $$\text{MAX}\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta$$

This means that race migration only occurs if the current improvement is smaller that the threshold level $\delta$.

The immigration rate is reduced to about 5–10% by only considering the best strings to be migrated, and reranking is then needed after migration (immigration) between races.

Figure 18:
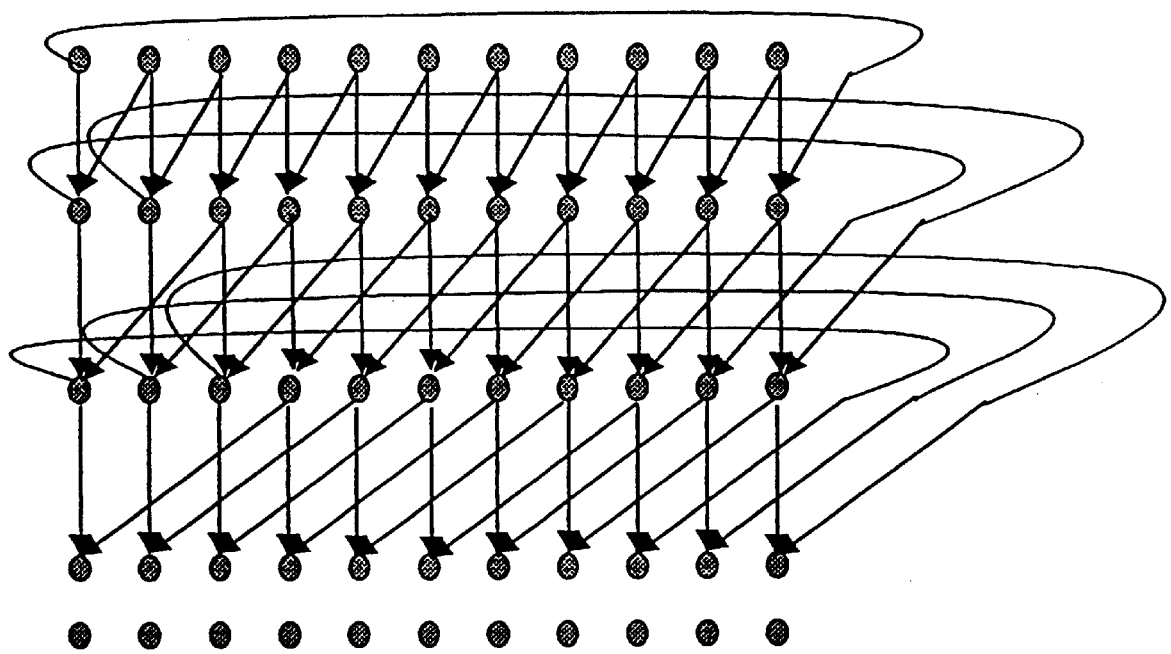
FIG. 18 is a further block diagram of parallel racial inheritance of the method.

If race migration is to be executed, crossover race migration is executed, as shown in FIG. 18, by crossing over to the adjacent race. In FIG. 18 the columns 40 represent the races, whereas the rows 42 represent the sequential generations. From the above it will be appreciated that race migration is restricted so that communication between races is minimised, whilst the chip planning method still provides for two-dimensional inheritance, i.e. either vertical inheritance between population generations, or horizontal inheritance between different races in the migration process.

The chip planning method also adjusts the interconnecting area and pin assignment to be optimised by adjusting the fixed and flexible blocks as follows. Given a virtual representation for a float block is given by, $$A(j)_{virtual} = A(j) + \sum_{k=1}^{4}\left[\sqrt{A(j)} * N_{pin}^{k} * D_{wirepitch} \Big/ \left(2 * N_{routing\text{-}layer}\right)\right]$$

where j=1, 2, . . . , N and N is float block number, $N_{pin}$ is the pin number for block j, $N_{routing\ layer}$ is the number of the routing layer which is used and $D_{wirepitch}$ is a known technology parameter for routing. Whereas for a fixed block $$A(j)_{virtual} = A(j) + \sum_{k=1}^{4}\left[LW(j) * N_{pin}^{k} * D_{wirepitch} \Big/ \left(2 * N_{routing\text{-}layer}\right)\right]$$

where j=1, 2, . . . , (M-N), where M is block amount and LW(j) is the length or width of fixed block j.

Figure 19:
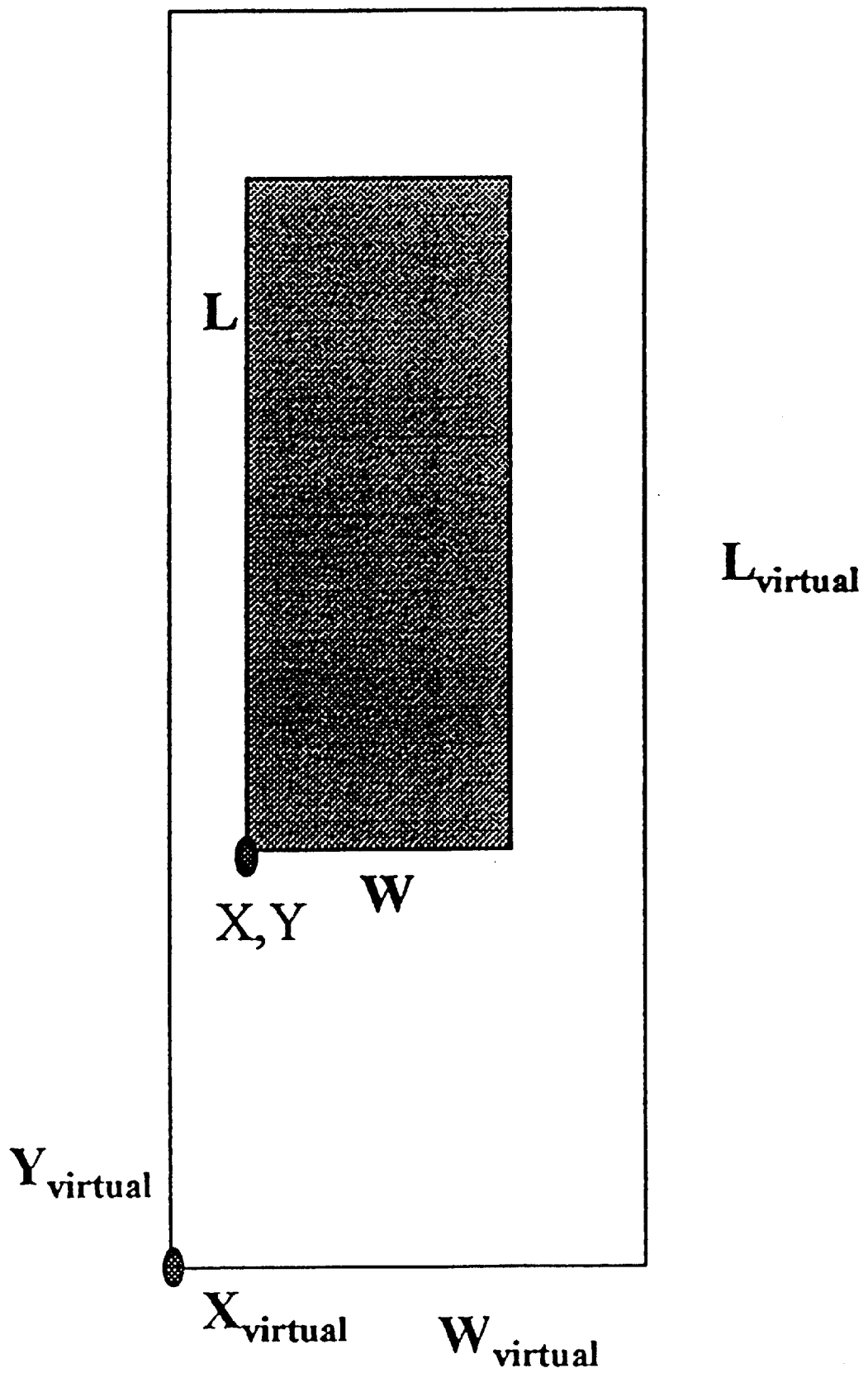
FIG. 19 is a block diagram of block resizing and relocation of the method.

The blocks, as shown in FIG. 19, can then be resized and relocated as follows.

Figure 20:
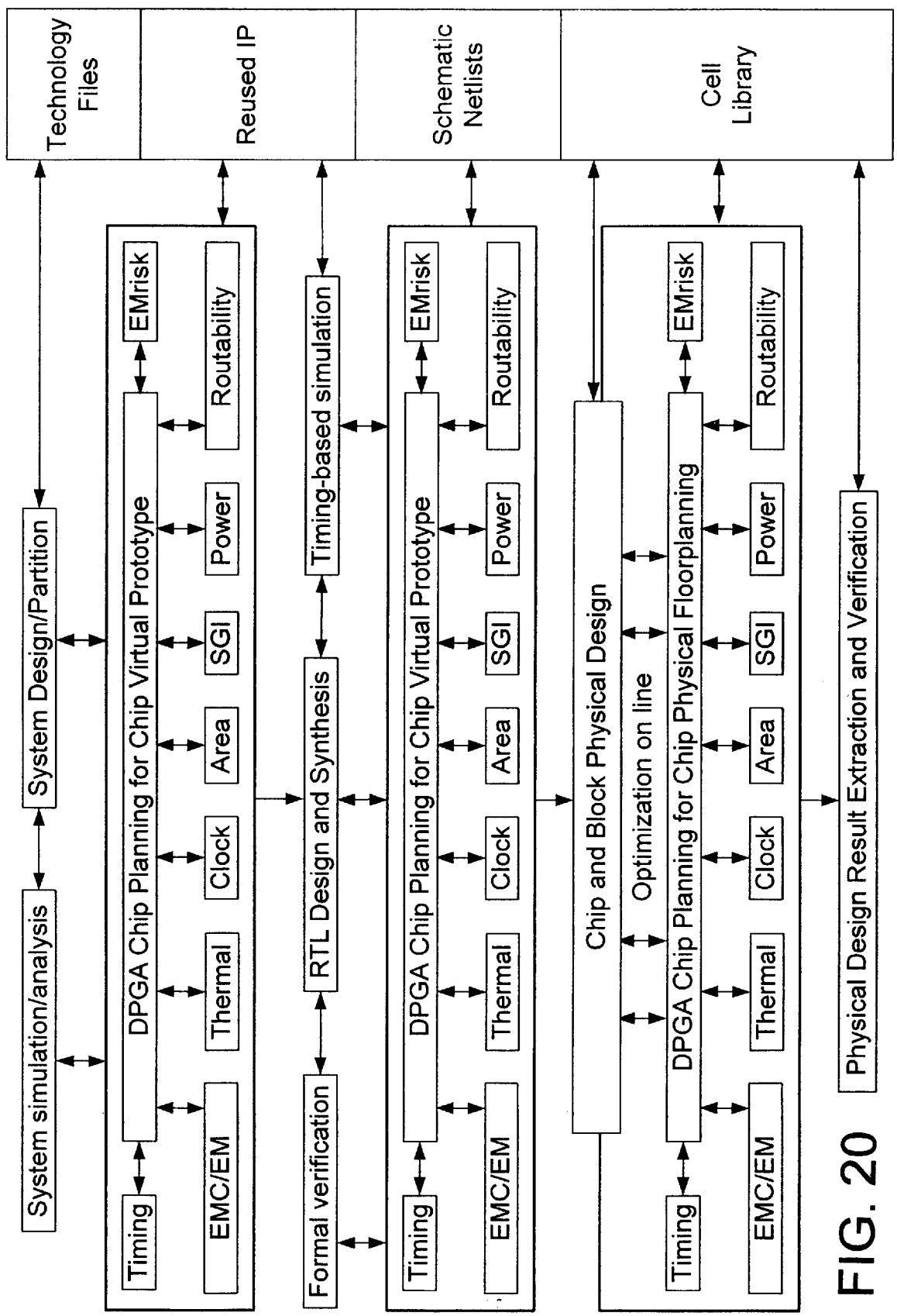
FIG. 20 is a block diagram of use of the method in various stages of chip planning.

For fixed blocks:

$W = W_{virtual} - 0.5 * (N_{pin}^{left} + N_{pin}^{right}) * D_{wirepitch}$ $L = L_{virtual} - 0.5 * (N_{pin}^{up} + N_{pin}^{down}) * D_{wirepitch}$ $X = X_{virtual} - 0.5 * N_{pin}^{left} * D_{wirepitch}$ $Y = Y_{virtual} - 0.5 * N_{pin}^{right} * D_{wirepitch}$ For float blocks:

$L = (L_{virtual}/W_{virtual}) * \text{Area}$ $W = L * (W_{virtual}/L_{virtual})$ $X = X_{virtual} + (N_{pin}^{left}/(N_{pin}^{left} + N_{pin}^{right})) * (W_{virtual} - W)$ $Y = Y_{virtual} + (N_{pin}^{down}/(N_{pin}^{down} + N_{pin}^{up})) * (L_{virtual} - L)$ The solutions provided by the above DPGA chip planning method can then be optimised by the designer as desired and the relevant data stored in a system design library. The chip planning method is then able to execute on the basis of the updated or optimised information and continue searching for new solutions to optimise the chip plan. In this manner, the DPGA chip planning method can be considered to be able to execute optimisation of the chip plan on-line, as well as at various other stages of the design process, as shown in FIG. 20.

In test results, the DPGA chip planning method when executed on a workstation 30 has proved to be up to more than 360 times faster than the sequential genetic algorithm method developed by the University of California, Berkeley, and produces results with less than 4% error. The best accurate solutions obtained by the method could not even be obtained by the known sequential genetic algorithm. The pin pad assignment executed by the interconnecting area pre-assignment significantly reduces delay and electro-migration risk, and the block resizing improves routability and also reduces delay.

Many modifications will be apparent to those skilled in the art without parting from the scope of the present invention as herein described with reference to the accompanying drawings.

What is claimed is:

1. An IC chip planning method based on a dynamic parallel genetic algorithm comprising the steps of:

using a speckle model to describe a solution distribution in a solution space;

applying operators for genetic operations wherein the operators include peristalsis operators and mutation operators;

controlling the rate of crossover, mutation and peristalsis operations dynamically to generate a population of child strings from a population of gene strings, the population of child strings representing a plurality of chip plans for an integrated circuit;

executing a dynamic ranking strategy on the population of child strings; and executing parallel racial inheritance on the ranked population of child strings for two-dimensional inheritance.

2. An IC chip planning method as claimed in claim 1, wherein said peristalsis operators are based on the speckle model.

3. An IC chip planning method as claimed in claim 2, wherein the peristalsis operator is an operator selected from the group consisting of:

selecting one operand and changing the selected operand's aspect ratio within bound in a parent solution to be a child solution, changing one operator in a parent string to be a child string, exchanging two neighbouring operands or two neighbouring arthrosis or one operand and arthrosis which neighbour a child string, and exchanging one operand or arthrosis and one operator, which neighbour a child string;

and the mutation operation is an operation selected from the group consisting of:

selecting one operator, or operand, or arthrosis and inserting it into a parent string to be a child string, if the child string is feasible, selecting a set of operands ($1 \leq N_{operand} \leq k$) and changing their aspect ratio within bounds in a parent solution to be a child solution, swapping two operands or arthrosis randomly, switching a set of operators ($1 \leq N_{operator} \leq k-1$), and swapping an operator and an operand or arthrosis if the result is feasible.

4. An IC chip planning method as claimed in claim 3, wherein the arthrosis is a cluster which includes two operands and one operator in sequence, and the arthrosis is an operand in a peristalsis operation.

5. An IC chip planning method as claimed in claim 1, wherein said speckle model represents a distributed solution space where the probability P of finding an improved solution among said child strings is given by $$P = \sum_{i=1-k}^{k} (q * E^m / D^n)$$

where E is an error in one of said child strings and D is the distance from a current best result represented by one of said child strings, q, m, n are constants greater than one and related to said solution space, and K is the number of blocks involved in said chip planning.

6. An IC chip planning method as claimed in claim 1, including dynamically controlling a rate of migration from said gene strings to said child strings at one of a plurality of control levels.

7. An IC chip planning method as claimed in claim 6, wherein controlling said rate includes selecting a rate MPrate of migration for mutation and applying said operators based on a control level that is determined by the number of strings in the current generation $N_{generation}$ and the current generation number ACTgen.

8. An IC chip planning method as claimed in claim 7, wherein said control level increases with increasing $N_{generation}$.

9. An IC chip planning method as claimed in claim 7, wherein controlling said rate includes setting a level for said MPrate on the basis of the rate of change of parameters of a solution function.

10. An IC chip planning method as claimed in claim 9, wherein said control level increases with decreasing rate of change of said parameters.

11. An IC chip planning method as claimed in claim 9, including executing a dynamic control on said population of gene strings by executing a ratio control on the blocks of the population of gene strings based on said MPrate.

12. An IC chip planning method as claimed in any one of claims 7 to 10, including executing dynamic control on said population of gene strings by executing a ratio control on the blocks of the population based on said MPrate.

13. An IC chip planning method as claimed in claim 1, wherein said dynamic ranking strategy includes adjusting parameters of a solution function based on one of a plurality of control levels.

14. An IC chip planning method as claimed in claim 13, wherein said control level increases with increasing number of said child strings in a current generation $N_{generation}$.

15. An IC chip planning method as claimed in claim 13, wherein said control level increases with decreasing rate of change of said parameters.

16. An IC chip planning method as claimed in claim 1, including:
assigning said gene strings and child strings to respective races for migration between generations of said gene strings;
controlling said migration to maintain said gene strings within said races; and
allowing migration between said races when a race inheritance condition is satisfied.

17. An IC chip planning method as claimed in claim 16, wherein said race inheritance condition is satisfied when the rate of change of parameters of a solution function is less than a predetermined threshold.

18. An IC chip planning method as claimed in claim 16, wherein said race inheritance condition is satisfied when $$\text{MAX}\left\{ \left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right| \right\} < \delta.$$

19. An IC chip planning method as claimed in any one of claims 16 to 18, wherein race migration is executed by crossing strings over to an adjacent race for sequential generations for which the condition is satisfied.

20. An IC chip planning system, including:
means for using a speckle model to describe a solution distribution in a solution space;
means for applying operators for genetic operations wherein the operators include peristalsis operators and mutation operators;
means for controlling the rate of crossover, mutation and peristalsis operations dynamically to generate a population of child strings from a population of gene strings, the population of child strings representing a plurality of chip plans for an integrated circuit;
means for evaluating a solution with a dynamic ranking strategy; and
means for executing parallel racial inheritance on the ranked population of child strings for two-dimensional inheritance.

21. An IC chip planning system as claimed in claim 20, wherein said operators are peristalsis operators based on the speckle model.

22. An IC chip planning system as claimed in claim 21, wherein said speckle model represents a distributed solution space where the probability P of finding an improved solution among said child string is given by $$P = \sum_{i=1-k}^{k} (q * E^m / D^n)$$

where E is the error in one of said child strings and D is the distance from a current best result represented by one of said child strings, q, m, n are constants greater than one and related to said solution space, and K is the number of blocks involved in said chip planning.

23. An IC chip planning system as claimed in claim 20, including rate control means for dynamically controlling a rate of migration from said gene strings to said child strings at one of a plurality of control levels.

24. An IC chip planning system as claimed in claim 23, wherein controlling said rate control means selects a rate MPrate of migration for mutation and applying said operators based on a control level that is determined by the number of strings in the current generation $N_{generation}$ and the current generation number ACTgen.

25. An IC chip planning system as claimed in claim 24, wherein said control level increases with increasing $N_{generation}$.

26. An IC chip planning system as claimed in claim 24 wherein said rate control means sets a level for said MPrate on the basis of the rate of change of parameters of a solution function.

27. An IC chip planning system as claimed in claim 26, wherein said control level increases with decreasing rate of change of said parameters.

28. An IC chip planning system as claimed in any one of claims 24 to 27, including ratio control means for executing dynamic control on said population of gene strings by executing ratio control on the blocks of the population of gene strings based on said MPrate.

29. An IC chip planning system as claimed in claim 26, including ratio control means for executing dynamic control on said population of gene strings by executing ratio control on the blocks of the population of gene strings based on said MPrate.

30. An IC chip planning system as claimed in claim 23, wherein said evaluating means executes dynamic ranking by adjusting parameters of a solution function based on one of a plurality of control levels.

31. An IC chip planning system as claimed in claim 30, wherein said control level increases with increasing number of said child strings in the current generation $N_{generation}$.

32. An IC chip planning system as claimed in claim 30, wherein said control level increases with decreasing rate of change of at least one parameter.

33. An IC chip planning system as claimed in claim 20, including:
   means for assigning said gene strings and child strings to respective races for migration between generations of said gene strings;
   means for controlling said migration to maintain said gene strings within said races; and
   means for allowing migration between said races when a race inheritance condition is satisfied.

34. An IC chip planning system as claimed in claim 33, wherein said race inheritance condition is satisfied when the rate of change of parameters of a solution function is less than a predetermined threshold.

35. An IC chip planning system as claimed in claim 33, wherein said race inheritance condition is satisfied when $$\text{MAX}\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta.$$

36. An IC chip planning system as claimed in any one of claims 33 to 35, wherein said allowing means executes race migration by crossing strings over to an adjacent race for sequential generations for which the condition is satisfied.

37. An IC chip planning tool, including:
   code for generating a population of gene strings representing IC chip planning through crossover, mutation, and peristalsis operations;
   code for executing crossover, mutation, and peristalsis under dynamic control in the rate of the operations;
   code for evaluating a solution in the population with a dynamic ranking strategy;
   code for applying a parallel racial inheritance for two-dimensional inheritance;
   code for block sizing and resizing in pre-chip planning and post-chip planning; and
   code for two phase pin assignment and optimisation.

38. An IC chip planning tool as claimed in claim 37, including rate control code for executing dynamic control of a rate of migration from said gene strings to at least one child string at one of a plurality of control levels.

39. An IC chip planning tool as claimed in claim 38, wherein controlling said rate control includes selecting a rate MPrate of migration for mutation and applying operators based on a control level that is determined by the number of strings in the current generation $N_{generation}$ and the current generation number ACTgen.

40. An IC chip planning tool as claimed in claim 39, wherein said control level increases with increasing $N_{generation}$.

41. An IC chip planning tool as claimed in claim 39, wherein controlling said rate control includes setting a level for said MPrate on the basis of the rate of change of parameters of a solution function.

42. An IC chip planning tool as claimed in claim 41, wherein said control level increases with decreasing rate of change of said parameters.

43. An IC chip planning tool as claimed in claim 41, including code for executing dynamic control on said population of gene strings by executing a ratio control on the blocks of the population of gene strings based on said MPrate.

44. An IC chip planning tool as claimed in any one of claims 39 to 42, including code for executing dynamic control on said population by executing a ratio control on the blocks of the population based on said MPrate.

45. An IC chip planning tool as claimed in claim 37, wherein said evaluating code executes dynamic ranking by adjusting parameters of a solution function based on one of a plurality of control levels.

46. An IC chip planning tool as claimed in claim 45, wherein said control level increases with increasing number of at least one child string in the current generation $N_{generation}$.

47. An IC chip planning tool as claimed in claim 45, wherein said control level increases with decreasing rate of change of said parameters.

48. An IC chip planning tool as claimed in claim 37, including:
   code for assigning said gene strings and at least one child string to respective races for migration between generations of said gene strings;
   code for controlling said migration to maintain said gene strings within said races; and
   code for allowing migration between said races when a race inheritance condition is satisfied.

49. An IC chip planning tool as claimed in claim 48, wherein said race inheritance condition is satisfied when the rate of change of parameters of a solution function is less than a predetermined threshold.

50. An IC chip planning tool as claimed in claim 48, wherein said race inheritance condition is satisfied when $$\text{MAX}\left\{\left|\frac{\partial A(I)}{\partial I}\right|, \left|\frac{\partial D(I)}{\partial I}\right|, \left|\frac{\partial R(I)}{\partial I}\right|, \left|\frac{\partial C(I)}{\partial I}\right|\right\} < \delta.$$

51. A chip planning tool as claimed in any one of claims 48 to 50, wherein race migration is executed by crossing strings over to an adjacent race for sequential generations for which the condition is satisfied.

* * * * *